United States Patent
Pack et al.

(10) Patent No.: US 7,231,628 B2
(45) Date of Patent: Jun. 12, 2007

(54) METHOD AND SYSTEM FOR CONTEXT-SPECIFIC MASK INSPECTION

(75) Inventors: Robert C. Pack, Foster City, CA (US); Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 229 days.

(21) Appl. No.: 10/620,284

(22) Filed: Jul. 14, 2003

(65) Prior Publication Data

US 2004/0133369 A1 Jul. 8, 2004

Related U.S. Application Data

(60) Provisional application No. 60/395,467, filed on Jul. 12, 2002.

(51) Int. Cl.
*G06F 17/50* (2006.01)
(52) U.S. Cl. .......................... 716/19; 716/21
(58) Field of Classification Search ............ 716/19–21; 430/5, 22, 30
See application file for complete search history.

(56) References Cited

U.S. PATENT DOCUMENTS

| | | | |
|---|---|---|---|
| 4,247,203 A | | 1/1981 | Levy et al. |
| 5,553,273 A | | 9/1996 | Liebmann |
| 5,553,274 A | | 9/1996 | Liebmann |
| 5,567,550 A | | 10/1996 | Smayling |
| 5,580,687 A | | 12/1996 | Leedy |
| 5,740,068 A | | 4/1998 | Liebmann et al. |
| 5,821,014 A | | 10/1998 | Chen et al. |
| 5,879,866 A | | 3/1999 | Starikov et al. |
| 5,932,377 A | * | 8/1999 | Ferguson et al. ............. 430/5 |
| 5,965,306 A | | 10/1999 | Mansfield et al. |
| 6,051,347 A | | 4/2000 | Tzu et al. |
| 6,168,891 B1 | | 1/2001 | Shibata |
| 6,282,696 B1 | * | 8/2001 | Garza et al. ................... 716/19 |
| 6,285,488 B1 | | 9/2001 | Sandstrom |
| 6,421,820 B1 | | 7/2002 | Mansfield et al. |
| 6,456,899 B1 | | 9/2002 | Gleason et al. |
| 6,526,550 B1 | | 2/2003 | Badding et al. |
| 6,529,621 B1 | | 3/2003 | Glasser et al. |
| 6,535,774 B1 | | 3/2003 | Bode et al. |
| 6,560,766 B2 | | 5/2003 | Pierrat et al. |
| 6,571,383 B1 | | 5/2003 | Butt et al. |
| 6,578,188 B1 | * | 6/2003 | Pang et al. .................... 716/19 |
| 6,579,651 B2 | | 6/2003 | Subramanian et al. |
| 6,625,801 B1 | | 9/2003 | Pierrat et al. |
| 6,634,018 B2 | * | 10/2003 | Randall et al. ................ 716/19 |

(Continued)

FOREIGN PATENT DOCUMENTS

EP 1031876 A 8/2000

OTHER PUBLICATIONS

Goering, R. "SEMI's Oasis provides respite from GDSII", *EE Times* Oct. 1, 2002.

(Continued)

*Primary Examiner*—Jack Chiang
*Assistant Examiner*—Binh Tat
(74) *Attorney, Agent, or Firm*—Bingham McCutchen LLP

(57) ABSTRACT

A method for inspecting lithography masks includes generating integrated circuit design data and using context information from the integrated circuit design data to inspect a mask.

19 Claims, 8 Drawing Sheets

U.S. PATENT DOCUMENTS

| | | |
|---|---|---|
| 6,654,488 B1 | 11/2003 | Behun et al. |
| 6,658,640 B2 | 12/2003 | Weed |
| 6,670,082 B2 | 12/2003 | Liu et al. |
| 6,703,167 B2 * | 3/2004 | LaCour ............................ 430/5 |
| 6,748,578 B2 | 6/2004 | Cobb |
| 6,787,271 B2 | 9/2004 | Cote et al. |
| 6,868,537 B1 | 3/2005 | Ho et al. |
| 6,901,574 B2 | 5/2005 | LaCour et al. |
| 7,107,571 B2 | 9/2006 | Chang et al. |
| 2002/0026626 A1 * | 2/2002 | Randall et al. ............... 716/19 |
| 2002/0102476 A1 | 8/2002 | Hayano et al. |
| 2002/0155357 A1 | 10/2002 | LaCour |
| 2002/0157068 A1 | 10/2002 | LaCour et al. |
| 2002/0160281 A1 | 10/2002 | Subramanian et al. |
| 2003/0018948 A1 | 1/2003 | Chang et al. |
| 2003/0023939 A1 | 1/2003 | Pierrat et al. |
| 2003/0126581 A1 | 7/2003 | Pang et al. |
| 2003/0160980 A1 | 8/2003 | Olsson et al. |
| 2003/0165749 A1 * | 9/2003 | Fritze et al. .................... 430/5 |
| 2003/0200523 A1 | 10/2003 | Takahashi et al. |
| 2004/0013952 A1 | 1/2004 | Elian et al. |
| 2004/0044984 A1 | 3/2004 | Keogan et al. |
| 2004/0067423 A1 * | 4/2004 | Chen et al. ..................... 430/5 |
| 2004/0107412 A1 * | 6/2004 | Pack et al. .................... 716/19 |
| 2004/0133369 A1 | 7/2004 | Pack et al. |
| 2004/0172610 A1 | 9/2004 | Liebmann et al. |

OTHER PUBLICATIONS

Wong, Alfred K., "Resolution Enhancement Techniques in Optical Lithography", SPIE Press, 2001, Chapter 1.

Liebmann, L.W. et al., "TCAD Development for Lithography Resolution Enhancement", IBM Journal of Research and Development, vol. 45, No. 5, Sep. 2001.

Pack, R.C. et al., "GDS-3 Initiative: Advanced Design-through-Chip Infrastructure for Sub-Wavelenth Technology", Proceedings of SPIE, vol. 4692, 2002, pp. 566-584.

Matsuyama, T. et al. "The novel inspection system with design rule check for high accuracy reticules" Proceedings of the SPIE—The International Society of Optical Engineering (1999) 3748:563-571.

McCall, J. et al. "Integrated method of mask data checking and inspection data prep for manufacturable mask inspection: inspection rule violations" Proceedings of SPIE—The International Society for Optical Engineering (Oct. 3, 2001) 4562:161-170.

International Search Report for PCT/US2003/021997 dated Jan. 15, 2004.

European Search Report for Appl. No. 03764633.8 dated Apr. 24, 2006.

* cited by examiner

METHOD AND SYSTEM FOR CONTEXT-SPECIFIC MASK INSPECTION

CROSS REFERENCE TO RELATED APPLICATION

This application claims the benefit of U.S. Provisional Application No. 60/395,467, filed Jul. 12, 2002, entitled METHOD AND SYSTEM FOR CONTEXT-SPECIFIC MASK INSPECTION, which is incorporated herein by reference in its entirety.

FIELD OF THE INVENTION

The present invention relates to the field of photomasks for photolithographic production of integrated chips.

BACKGROUND OF THE INVENTION

Photolithography is a fabrication process by which patterns for various devices, such as integrated circuits (IC), are generated on substrate wafers. This process generally starts with the design of an IC chip, including the various circuit elements, their electrical interconnects, and their physical layout across the chip. The IC design typically describes each layer required to fabricate the IC in a FAB using a photolithographic process. There are generally many layers to an IC chip.

After an integrated circuit is designed, a photomask is created. A photomask, or more simply a mask, provides the master image of one layer of a given integrated chip's physical geometries. Masks are critical to the lithography process. There are different types of masks, including binary chrome-on-glass, attenuated phase-shifting masks (attPSM), and alternating phase-shifting masks (altPSM). The mask is usually inspected for defects before being used to replicate the mask image in reduced size onto a wafer by the photolithography system that builds the intended IC. Various mask inspection systems may be used to inspect a mask, including scanning electron microscope (SEM)-based and optical microscope-based systems. Additionally, other non-traditional 'microscopes' may be used, including atomic force microscopy (AFM). Furthermore, metrology and other measurement techniques, regardless of dimensionality (1-D, 2-D or 3-D) may also be considered. A mask inspection system compares an image of the mask with another mask or with a mask database to find defects. Defects found in the mask will often be repaired, so that they will not be replicated on or introduce harmful distortions to the chips created from that mask.

A conventional photolithography system projects UV light energy on to and through the mask in order to transmit the mask pattern in reduced size to the wafer surface, where it interacts with a photosensitive coating on the wafer. The photomask is a critical piece of the photolithography process, because it holds the essential integrated circuit design pattern information for the circuits that are replicated from that mask. Masks may be created by various processes. In one method, an electron beam or a laser-based system is used in a photolithographic process to write the pattern on the mask in accordance with mask data developed to produce the intended chip pattern on the wafer.

The resolution limit of today's optical lithography technology is increasingly being challenged by the sub wavelength, or low-k1, dimensions of the critical IC feature geometries. Not only are the critical dimension feature geometries decreasing in size in accordance with, or even faster than, Moore's Law predictions, the already large number of these feature geometries is growing at a dramatic rate as well. Furthermore, due to the necessity to mitigate optical proximity effect distortions through resolution enhancement techniques at the mask level, the overall polygonal figure count is skyrocketing. These critical feature geometries should be patterned and inspected far more precisely as well, due to the severity and sensitivity of the non-linear imaging. (These effects are often referred to in this context as resulting from the mask error enhancement factor, or MEEF). Extreme precision is required for sub wavelength (or low-k1) applications, due to highly non-linear imaging behaviors which often magnify mask errors by large factors.

With the overall year-to-year increase in logic functions performed by an IC, industry trends towards larger and more complex system-on-chip and mixed signal designs, and increasingly aggressive use of artificial Layout Enhancement for Manufacturability (LEM) features such as Resolution Enhancement Technology (RET) and dummy fill patterns, IC physical design layout data volume and resulting mask data file volume sizes are exploding. The overall design and manufacturing process integration complexity is also expanding, as it attempts to span a widening and deepening gap between the different technical disciplines and 'cultures' of manufacturing and design. This has led to increases in the length of time to create and inspect masks, in the number of errors impacting mask elements, and in the costs associated with the mask process.

Some of these problems are described with respect to a traditional photolithography process, including mask creation and inspection methods, as shown in FIG. 1. At block 102, an integrated chip (IC) design is created, often by using various EDA systems such as those produced by Cadence Design Systems, Inc., of San Jose, Calif., to effect a desired product design. An IC design flow typically starts with a desired circuit operation, then proceeds to a design layout and a set of circuit elements expected to produce that desired operation. The IC design process 102 usually includes circuit design and analysis, layout synthesis and routing, and verification and tapeout, to produce a set of circuit elements in a layout that can effect a desired circuit's electrical operation on a layer-by-layer basis. This process is often referred to as the design flow. For background on IC design and mask manufacturing processes, see *Resolution Enhancement Techniques in Optical Lithography*, Chapter 1, by Alfred K. Wong, SPIE Press, 2001, which is incorporated by reference in its entirety.

Up until tapeout, a vast amount of information is available on: the relation of the physical layout to the design schematic or netlist; individual circuit element models and properties; circuit criticalities; and the manufacturing assumptions used in creating the IC design. Furthermore, the information is typically in a design hierarchy of fundamental library base cells, or 'hard IP,' in the form of predesigned and characterized blocks or 'cores.' Circuit elements at this level may include, for example, transistors, power buses, resistors, capacitors, and interconnects. Logos and manufacturing elements, such as area fill cells, may also be included. Tapeout is typically the last process in the IC design flow, and is the 'handoff' mechanism to the manufacturing process. Typically, tapeout produces a geometries-only design hierarchical data file in GDS-II stream format. However, a wealth of design knowledge is stripped out of this geometry-only format, and therefore is unavailable to any data file derived from it or any design or manufacturing integration process performed thereafter.

Due to fundamental inherent limitations in current and near-future optical lithography processes, the layout of the IC design is no longer directly equivalent to the pattern printed on the eventual IC wafer. As a result, various Resolution Enhancement Techniques (RETs) may be used to compensate for various distortions, or to enable higher resolution, through advanced optical techniques. For background information on RETs, see *Resolution Enhancement Techniques in Optical Lithograph*. Chapter 1, by Alfred K. Wong, SPIE Press, 2001; and TCAD Development for Lithography Resolution Enhancement, by *L. W. Liebmann et al, IBM Journal of Research and Development*, Vol. 45, No. 5, September 2001, both of which are incorporated by reference in their entirety. RETs are typically added at the bottom of the design flow, prior to tapeout, and out of view of the designer. However, increasingly more and more RET impact is being dealt with upstream in the design flow, with layout consideration, and even RET insertion, being applied earlier.

A mask data preparation and job deck creation process 104 then follows the creation of the IC design. This starts the mask flow, which runs through mask inspection and repair. Knowledge of the mask writing process, and to some extent the photolithography process, may be employed in "fracturing" the GDS-II design database into a data file for use with the writing tool. Typically, the writing tool uses a MEBES data file format (although other formats may also be used). The MEBES file holds polygon and geometry information to be used in writing the mask. However, like the GDS-II stream file, this file holds none of the higher-level IC design, circuit feature functionality, or criticality information available in the IC design flow. A MEBES file may include information detailing polygonal shapes, dimensions, positions on the mask, manufacturing features added to improve lithographic fidelity at the chip surface, and other parameters. However, there is no 'knowledge' of what a feature is beyond its geometry and location. Very little "design" is done at this block, as the IC design process sets the layout and often most of the RET, leaving only fracturing, job deck creation, and secondary chip surface feature additions (such as registration marks) to be handled during the preparation of mask data 104, between IC design 102 and mask writing 106.

A mask writing process 106 follows. Mask writing often involves writing the polygonal shapes and layout of a mask design pattern (often a MEBES file) in a photo- or electron-sensitive coating (often called a "resist") on a mask substrate (often glass), then etching in chrome, glass or other materials associated with the specific mask technology being employed (such as attPSM or altPSM, for example). Mask writing may be based on various technologies, including electron beam-based or laser-based systems. The fidelity of a mask element written on a mask substrate may be defined by the energy applied, shaped-beam aperture employed, and the adjacency of other features, due to laser, electron or thermo-chemical proximity effects on the mask. Positive effects of increased time and beam energy on element writing may be offset by negative impacts resulting from thermal and chemical changes in the surrounding photoresist caused by the applied energy. There is a tradeoff between optimizing writing speed and the deleterious effects of thermal, chemical and proximity effects related to the writing speed.

A mask writing system is typically provided with and controlled by a database containing polygonal shape and layout information, such as a MEBES data file. At 'fracturing,' the mask data is prepared for the mask writing equipment by breaking the complex polygonal shapes into the simple base set of shapes as required and by applying mask writer electron- or laser-spot proximity, shape, exposure compensation, or other sizing operations to the data as needed. Numerous output files may be generated. The design data connectivity and 'design intent' have been destroyed by this point. Design data connectivity includes data relating to the electrical net list or schematic, functional intent, and criticality of the various IC elements. Thus, the writing tool, and other downstream activities, such as mask inspection, only receive simple polygonal shapes and location data. There is no knowledge of the design intention of a given polygon, nor any mechanism for establishing a relationship of the polygon to the rest of the design, in order to perform design-aware information processing. In such systems, from that point on, imaging operations of mask writing and inspection operate under the most general uniform imaging assumptions of isotropic imaging. Features are processed under the exact same conditions as their neighbors, and they are spatially invariant and device- and circuit-unaware. Thus, polygonal shapes across the mask are treated equally in terms of their importance to the effectiveness of the resulting circuit. As the IC industry moves to deep sub-wavelength, or 'low-k1' layout features, lens aberrations may increasingly violate these space-invariance assumptions, requiring additional higher-level consideration in the design flow as well as the mask flow.

In continuing reference to the example of typical photolithography processes as shown in FIG. 1, after mask writing, a mask inspection process 108 is performed. A mask that has been written or printed with polygonal mask elements is inspected for defects. Examples of mask inspection systems include scanning electron beam, deep UV optical-based, and atomic force microscopy systems. Photomask inspection machines typically include 'die-to-die' or 'die-to-database' modes of operation, using SEM or optical microscopy illumination. Whereas the die-to-die mode relies upon correlation of features between two die on the same mask plate to allow any differences to be displayed, the die-to-database approach allows correlation against a mask inspection file data. The latter is often preferred, as it offers correlation against ideal data. However, the time demands of the latter can be enormous, resulting in inspection equipment utilizing and requiring increasingly computationally powerful parallel computer architectures. The level of inspection may be determined by the resolution of the inspection system applied to a given mask element or mask area. Defects may include any departures from the mask design, such as missing, misaligned or misshapen pinholes, bridging features, holes, shapes, or a class of 'cosmetic' defects which include chrome outside of the working area of the die, contaminates such as glass chips on the edge of the mask, or other anomalies which will not be 'seen' by the lithography process nor by the silicon wafer.

Aside from cosmetic defects, defects in a mask are generally assumed to result in defects in an integrated circuit replicated from that mask. The process of classifying and waiving defects on this basis may be performed by a time consuming manual technique. The mask inspection may reference only the polygonal shape and layout information from the mask data file generated by the fracturing tool, often in a file format such as, for example, KLARIS (an abbreviation for KLA-Tencor Reticle Inspection System, produced by KLA-Tencor, Inc. of San Jose, Calif.). Little or no information from the IC design process relating to the function, relative importance, or criticality of individual mask elements is applied in comparing a mask to its mask design template. This is an isotropic approach to mask inspection, where each mask element is inspected equally in terms of the time and resolution of the inspection system, regardless of its relative importance to the operation of the resulting circuit. Additionally, when an unintended artifact is found, there may be no means for interpreting whether this artifact is a defect in the context of its impact on the circuit feature and manufacturing goals.

A defect analysis 110 examines the results of the mask inspection process to discern whether any defects were found. Typically, deviations from the ideal design are considered defects. Some mask defects, however, have no significant negative impact on a circuit produced from the mask, and thus may be ignored as essentially cosmetic, or "non-defects." Such "non-defects" typically include defects next to mask elements that do not require exact fidelity to effect their function, such as a logo or an area fill cell. Additionally, some defects may have a positive impact, and thus may be ignored or maintained on the mask. Such "positive defects" include, for example, a defect located at a distance (the Rayleigh distance, for example) from a mask element, such that the defect operates as a scattering bar, to enhance the depth of focus of the lithography for that mask element. Such 'non-defects' and 'positive' defects may be waived or determined not to be defects for purposes of defect analysis and correction.

The defect analysis 110 identifies defects, such as defects near or on the polygonal mask shapes, defects in relative positioning of shapes, or defects of unintended shapes on the mask, such as pinholes, bridging, isolated artifacts or "hard" or "soft" defects. Defects may also include opaque or transparent errors on a mask. Transparent defects may not be visible under certain inspection conditions, or in the alternative may be visible in the inspection condition but not in the use condition. Such transparent defects may impact the phase of light passing through them resulting in unwanted optical interference effects, while opaque defects block or alter such light in some way.

Each found defect is typically examined at defect decision block 112, to determine if it can be repaired or not. Also, the defect decision process 112 determines whether, if unrepairable, the defect can be accepted without repair. This decision may require advanced modeling and simulation of the defect under the specific lithography process conditions being employed. An "unrepairable defect" might, for example, be one that cannot be easily fixed by a repair process, such as focused ion-milling or deposition repair techniques. An unrepairable defect, as determined at decision block 112, causes the mask to be discarded, 116, and a new mask to be written.

If the defect can be repaired, a mask repair process 114 is performed. Mask defect repair often involves focused ion beam (FIB) repair. However, mask repair 114 performed by ion beam milling or other repair processes, may be more time-consuming and expensive than writing a new mask. Additionally, mask repair often creates further defects in a mask, by adding unwanted material during the ion milling process. The repair process may also erode the mask elements in an unwanted manner. Merely handling the mask may alter or damage it through any number of means, including electrostatic discharge (ESD). Therefore, after the mask defect is repaired, a further mask inspection process, 108, is performed, and the results are examined, 110, to determine whether a new defect has been introduced during the repair process. This repetitive cycle of inspecting, repairing, and inspecting again is often costly and time-consuming.

If no defects are found in the mask, or if the defects are waived, then a lithography process for IC chip fabrication 118 is performed. The mask is used in a photolithography system to transfer the mask pattern to a wafer during the integrated chip fabrication process 118. The mask allows light to pass through transparent sections defined by the polygonal mask elements previously written or etched thereon. An image of the mask so produced is then passed through an imaging lens system, often at a reduced image size, and replicated on a wafer surface through a lithography process. Thus, a mask plays a critical role in such systems transmitting the circuit design to the wafer surface.

SUMMARY OF THE INVENTION

A method for inspecting lithography masks includes generating integrated circuit design data and using context information from the integrated circuit design data to inspect a mask.

As will be made apparent to those skilled in the art, other and further aspects and advantages of the present invention will appear hereafter.

DETAILED DESCRIPTION

Figure 1:
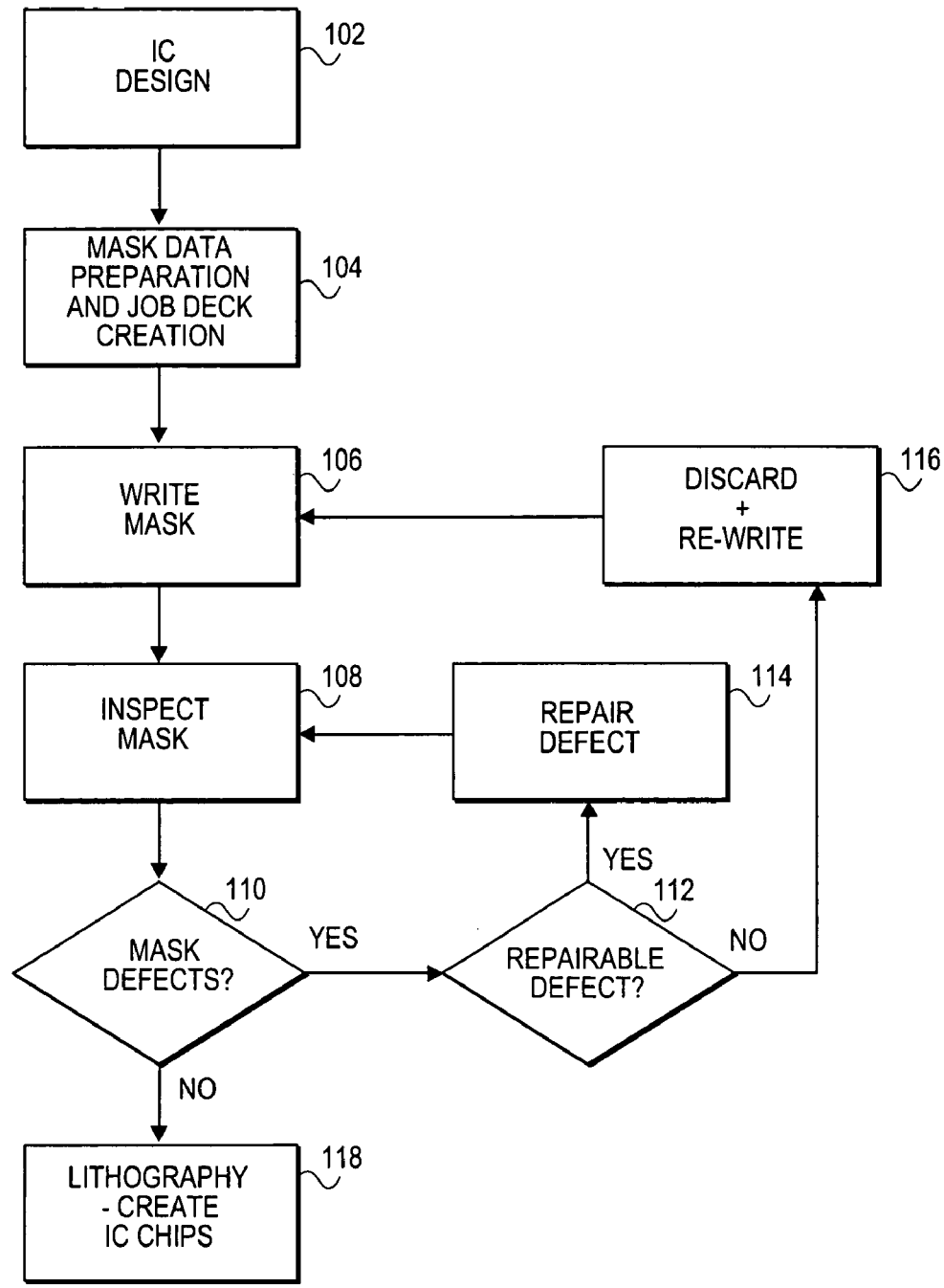
FIG. 1 is a flowchart view of an integrated chip design and manufacturing process.

A method and system is provided for improving mask inspection processes. In an embodiment, the information developed in designing an integrated circuit and photomask are used to give context to polygonal shapes that are inspected on a mask. Polygonal shapes of various circuit elements are inspected in light of their associated contextual information, such as priority, ordering, or inspection parameter information, for example. The contextual information may be added to a database and emphasized for use in guiding the mask inspection process. The contextual information may also include both manufacturing and circuit context parameters, and be used in processes that prioritize and order various features of the circuit or mask designs.

Contextual information related to the manufacturing process may include, for example: specified resolution; criticality; proximity-effect distortions; topological properties of a circuit layer resulting from mask features; chemical or thermal limitations; or weight factors, criticality or region-based prioritization, which may be beneficial for production quality and efficiencies. Contextual information related to the integrated circuit may include, for example: associations with and feature properties of an element in the circuit (e.g. MOSFET or interconnect); priority criteria for the element relative to other such elements; or critical tolerances.

Given the contextual information, each mask element may then be inspected in the context of its design, manufacturing, or other purpose, through its individual parameters, ranks or orders, such that each mask element receives an amount of mask inspection system consideration commensurate with the design- or manufacturing-specific context. System parameters such as ordering, resolution and analysis levels may also be adjusted in light of the contexts.

In one embodiment, a process is provided whereby chip and mask design information may be enhanced or re-ordered, and used throughout the mask inspection process. Such information may include contextual and priority information for each element or region on a mask, so that mask inspection system resources may be allocated more efficiently. In an embodiment, each mask element may be inspected with an amount of energy, time, resolution, analysis sophistication, and cost commensurate with its design or process purpose and its criticality commensurate with its design or process purpose, based on the contextual information, such as the element's context, priority, or ranking relative to other mask elements.

Embodiments of context specific mask inspection may be applied to inspecting the final patterned IC features on a silicon wafer, and the metrology of either the mask or the silicon. Embodiments of context specific mask inspection may also be applied to inspecting various IC technologies and materials, including silicon, silicon-on-insulator, silicon-germanium and gallium arsenide, as well as to inspections of integrated optical and mechanical "circuit" technologies, such as Integrated Optical Circuits, MEMS and micro-electro-optic-mechanical technologies.

In an embodiment demonstrating Context-Specific Mask Inspection, critical circuit features may be inspected in the context of the limiting processes and device physics, as well as the circuit's operational specifications. A perceived defect or deviation from the ideal layout may be waived or reclassified as a "non-defect" if the defect has little or no practical impact on the resulting product. To reach this determination, the deviation may be associated with certain IC layout features. The purpose of the associated layout features, in a circuit-sense or in a manufacturing sense, is provided by the context. These features may then be annotated to the IC netlist, or schematic. Furthermore, the 'operative physics' should be known. It should be known which processing or device physics may come into play towards the end of perturbing the end result of the finished IC. Knowing the operative physics and the purpose of the feature allows an understanding of aspects of how that anomaly interacts with the layout feature, such as the range of interaction and any type of process 'Error Enhancement Factor.' Next the criticality of the associated layout feature(s) to the resulting circuit or manufacturing process should be understood. Thus, if there is a deviation to a layout element, it may be discerned whether it is acceptable. By taking account of this a-priori knowledge of these contexts, intelligent decisions may be made based on costs, such as, for example, those related to performance impact or yield, or real costs of repair versus scrapping and writing a new mask.

According to an embodiment, design feed forward, or "Design-Enabled Manufacturing," is performed based on context specific mask inspection. This involves using or passing design intent information, such as device and net-to-physical-geometry relationships, directly or indirectly through priority or criticality data tags, to the mask writing tool and the mask inspection tool, so the shapes may be written and inspected spatially and temporally in the proper context of their eventual circuit performance. One benefit of passing this contextual information is that each shape to be inspected may be prioritized, and its inspection resolution and analysis level set in relation to its circuit importance, criticality, domain, sensitivity of physical interaction, and overall manufacturing goals. Significant efficiencies may be attained when vector-scan or raster-scan mask inspection systems are used, because image field size may be varied from a pinpoint to a broad opening. Additionally, with vector-scanning systems, inspection beam trajectories may be set to more efficiently inspect the mask in the context of the various mask elements. The same would apply when used in other inspection applications.

In an embodiment applied to mask inspection, a mask inspection system that performs an IC design feed forward process has data indicating knowledge of hierarchies of criticality. Therefore, the system is able to rank a feature list and adjust the beam size of the shaped beam mask inspection accordingly. Data ordering within the mask design database, based on an inspection queuing order, may be performed to provide significant efficiencies as compared to current relatively unordered streaming data techniques. As an example, such prioritization would allow inspection of the most critical transistors and nets of an IC design consistent with each feature's impact on the eventual product. This approach would prevent a relatively unimportant geometry, such as an area fill cell, from being inspected with the same precision as the most critical transistors and interconnect nets of the IC. It may also prevent a logo command from being treated as the most critical cell of what may be a company's most important IC product.

A hierarchy of feature importance and criticality may be ascertained on the basis of eventual circuit performance and manufacturing goals, thereby allowing a performance-yield inspection strategy to be implemented. Based upon feature criticality data, estimates of process effects and circuit impact may be made so that the beam order, shape, scan, and/or timing could be adjusted accordingly. Additionally, the context and classification of a found defect may additionally be considered in relationship to the manner in which it interacts optically with neighboring features, due to the operative physics of the lithographic stepper or scanner. In these systems, mask features and defects, including even sub-resolution features, may interact in non-intuitive manners, due to the highly non-linear imaging behavior of low-k1 lithography with partially coherent light and off-axis illumination. In a stepper system, these artifacts may coherently interact with local features in manners which are far more destructive than their small size or location might suggest under linear imaging, or alternatively which may be actually beneficial or of no consequence to the adjacent circuit feature.

Aside from the geometric distortions that may result due to unwanted mask artifacts, some of the distortions, when placed in the context of the IC design, may be classified as critical or non-critical. As an example, a distortion of a critical timing transistor due to a nearby artifact may result in the artifact being classified as a killer defect to be repaired. However a distortion of an area fill cell may be of no consequence, resulting in the artifact being waived as a defect. Thus, artifacts that might normally be considered defects might be waived if they can be shown to have no real impact on the manufactured chip and if the costs and risks of repair are shown to be disadvantageous, by using context specific mask inspection.

Figure 2:
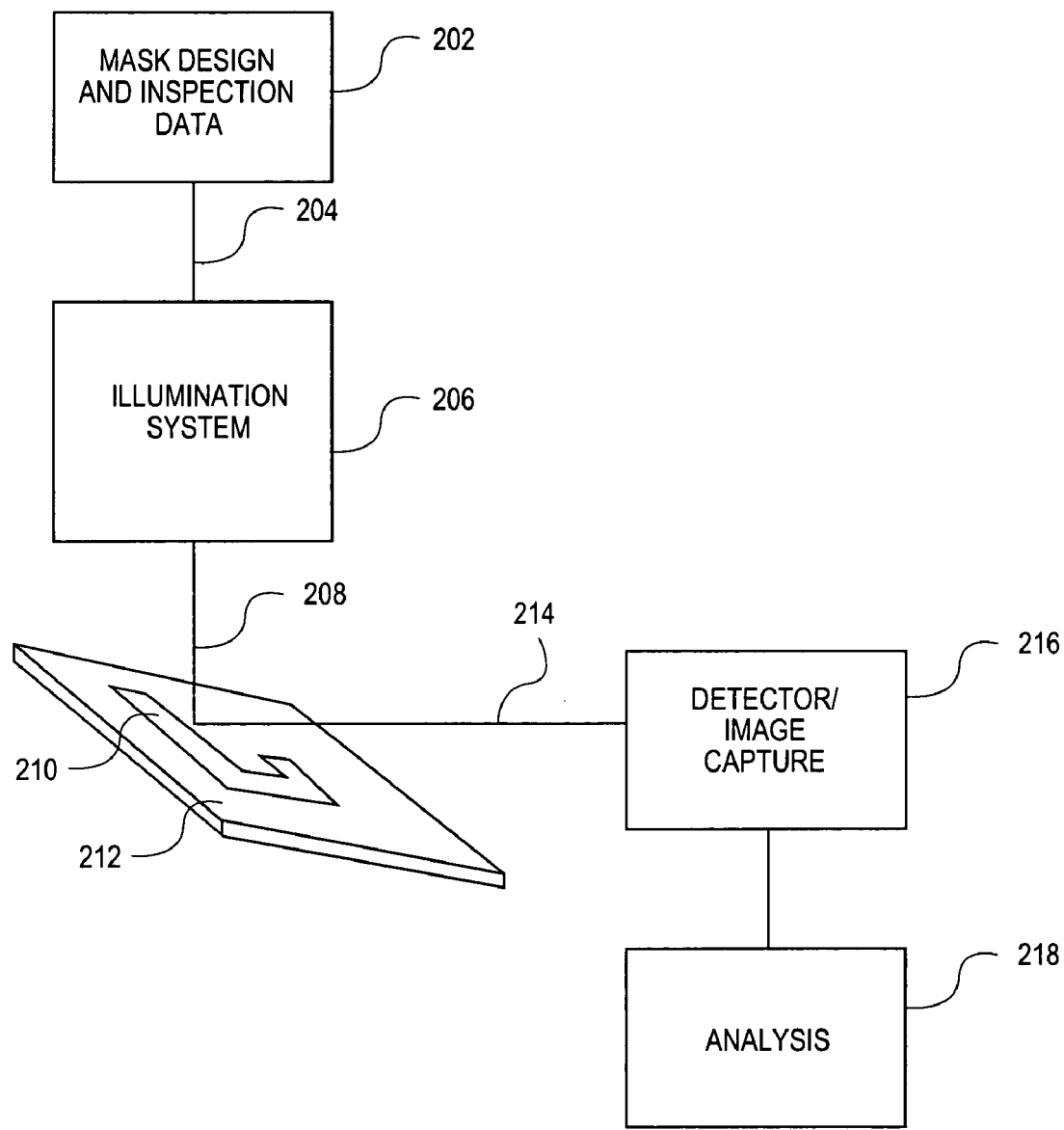
FIG. 2 is a schematic view of an example of a mask inspection system according to an embodiment of the present invention.

FIG. 2 represents a mask inspection system according to an embodiment of context specific mask inspection. Such systems may include, for example, electron beam-, laser- or atomic force-based imaging technologies. Mask design and inspection information 202 may be provided to a mask inspection system 206 via magnetic tape, disk cartridge, or another data transfer method 204, such as file transfer protocol (ftp) over an internet connection. Mask design and inspection data 202 is generally maintained on a computer readable medium, such as hard disk or other computer storage media. Such mask design and inspection data 202 may be used to define, for example, the resolution and/or image field size and location for the inspection system, or the order in which features, regions, or circuit blocks are inspected and analyzed in a desired layout on a mask surface 212. It may also be used to control the detector or image capture system 216 receiving the reflected or transmitted laser or electron beam 214 off the mask surface 212. Additionally, mask design and inspection data may be used by a defect analysis process 218.

As an illustrative example, the sample shape 210 may be defined in a mask design database by various context-specific parameters, including dimensions, shape, orientation, location on the mask, priority and criticality. The mask design and inspection data in an embodiment of context specific mask inspection includes contextual information, such as, for example, mask priority, circuit function and criticality, in addition to the polygonal shapes and location information found in conventional mask inspection files, such as KLARIS files for example. (This contextual information and the design feed-forward it enables are described in greater detail below with FIG. 3). The design information may be provided to mask inspection system software to control the parameters related to magnification, resolution, or field dimensions and location. Similar parameters may be used for inspection and other metrology technologies such as atomic force microscopy (AFM). The software may also control the direction, energy and timing of an electron beam or deep UV optical-based to inspect the desired shape, dimensions and location. Additionally, probe response data, as in atomic force microscopy, for example, may be captured and analyzed similarly. Furthermore, metrology and other measurement techniques, regardless of dimensionality (1-D, 2-D or 3-D) may also be considered.

By way of further illustrative example of an embodiment in a mask inspection system, an electron- or optical beam 206 may use various beam-scanning techniques. These beam-scanning technologies may include raster-scan or vector-scan techniques, both of which may incorporate variable image field sizing to control the image field. Thus, these systems may have the ability to inspect a mask area in both pinpoint and wider field cross-sections. A raster-scanning technique may be used such that an electron beam 208, for example, is scanned across a constantly moving glass photomask 212. Vector-scan techniques may use a more varied track of the beam 208 across a mask 212 to inspect shapes.

In context-specific mask inspection systems, there is an understanding of circuit level contexts, which allows the magnification of the system to be changed and to optimize its utilization in inspecting specific mask elements based on those elements specific to that element's circuit function based on those parameters. Therefore, such contextually based inspection systems can apply design context information, and thus each polygon on a mask is inspected with an appropriate amount of resolution and computational resources commensurate with its circuit function and criticality. Also, the understanding allows the beam 208 to be altered in energy, space, or time, and to optimize its utilization in inspecting mask elements based on those elements. Both raster-beam and vector-beam writing systems that use context-specific information no longer have to assume that each element is of equal importance and criticality. This allows the context-specific inspection system to avoid an isotropic imaging assumption, in which each pixel across a mask is treated similarly from the perspective of its functionality and criticality within the context of the ultimate circuit to be produced. Therefore, such contextually based inspection systems can apply design context information, and thus each polygon on a mask is inspected with an appropriate amount of energy, resolution, image capture parameters 216 and defect analysis 218 that can vary from that of other polygons on the mask.

In an embodiment of context specific mask inspection, the relative importance and functional context information of individual mask elements may be provided to the inspection system in a manner enabling more efficient control of the inspection system or beam 208, image capture 216 and defect analysis 218. Embodiments of context specific mask inspection may be effectively applied to various mask inspection systems, including those utilizing either raster-scan or vector-scan techniques. Both raster-scan and vector-scan technology may allow individual mask elements to be inspected with varying resolution and analysis, based on context-specific information, such as their relative importance and function.

Figure 3:
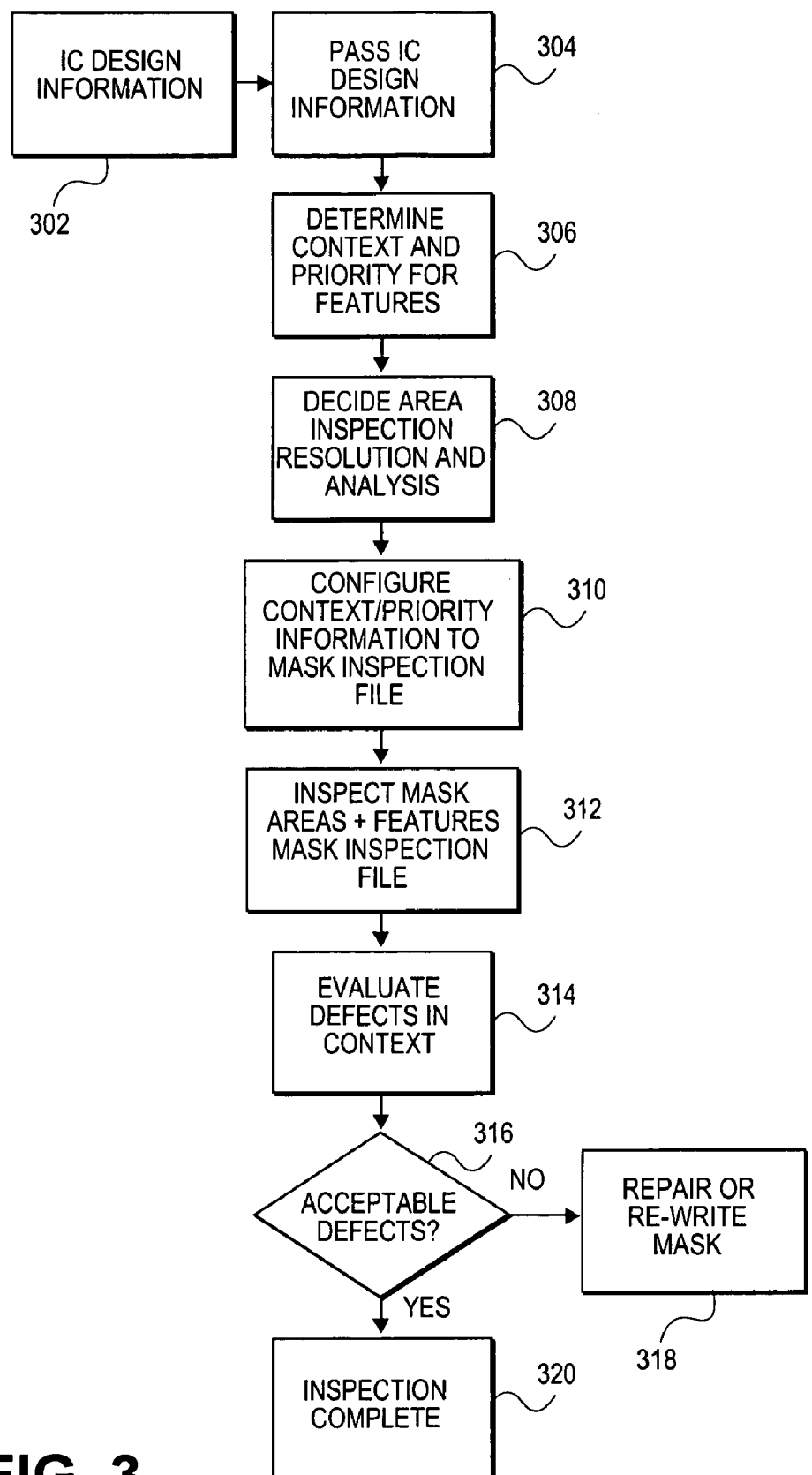
FIG. 3 is a flowchart view of an embodiment of a process for mask inspection.

FIG. 3 illustrates a mask inspection process according to an embodiment of context specific mask inspection. At block 302, an integrated circuit design process, or IC design flow, may include circuit design and analysis, layout synthesis and routing, verification and tapeout, producing a IC design database or data file in a manner which includes polygonal shape and location information for each element, as well as the element's circuit related and manufacturing related contextual information.

At block 304, IC design information and contextual information may be provided to a mask design process. For example, an IC design, including layout geometry data as well as circuit functionality and criticality contextual information, may be captured in a mask design database. The mask design database may be in an OpenAccess format, maintained on a computer readable medium, such as a hard disk or other various storage media, and transmitted across a network via file transfer protocol (ftp) or other internet protocol.

At block 306, a context and priority analysis may be applied. This analysis may be in addition to or in place of another priority analysis applied during a prior process, such as mask writing. For example, individual mask elements and their design data may be examined in relation to the operative physics of the mask, the wafer lithography process, and the inspection process. An individual mask element may also be examined in the context of the integrated circuit element it is intended to produce on a chip wafer. Such parameters as the function of the resulting circuit element, the criticality of that function to the operation of the circuit, and the priority or importance of the mask feature relative to other features on the mask, among other parameters, may be included in the contextual examination of individual mask elements. Criticality information may include the impact of a defect or potential defect on or near a mask element, while priority may include an indication that a mask element should be inspected in a certain order or at the same time as another element, such as in the case of matched transistor elements (DRAM sense amplifiers, for example).

In an embodiment of context specific mask inspection, determining mask manufacturing priority information 306 may be performed manually (via a user interface, for example) or via automated or computer-aided methods. In the most general case, this may be done through a combination of automated, computer-aided, and manual tools. For example, these tools may include critical net timing analysis. Critical nets are those wires and transistors which are the most likely to limit the overall circuit performance. The process 306 may also include determining the ensemble of critical nets which, across a process window, will impact the overall IC product's yield at a specified performance target.

In one embodiment, this data, as well as other a-priori design knowledge, is passed to manufacturing processes such as mask writing, mask and IC inspection, mask repair, and mask and silicon metrology. A product engineer may use various other semi-automated or manual tools drawn from a toolkit of simulation, analysis, or database access and mining, tools which allow the product engineer to tag regions, cells, blocks or other specific geometric elements on a basis of contextual information such as manufacturing needs, historical manufacturing learning, device physics requirements, and system uncertainties, for example. These tags then, according to an embodiment, may travel down stream in the mask flow, and remain available to give a context that allows an efficient and intelligent mask inspection process, as well as an intelligent mask writing process.

An embodiment of performing priority analysis 306 may include using a set of criteria, or thresholds, to categorize or prioritize mask elements based on contextual information, such as their function or criticality. For example, the criteria or thresholds be based on: critical timing nets; critical regions, blocks, or cells; less critical regions, blocks or cells, such as a logo or area fill cells; associations, such as matched transistor pairs; and location criticality, such as crossing of raster stripes.

Additionally, mask design data may account for the context of the mask writing and inspection equipment, and the process performed by the equipment. Contextual data, such as information relating to lithography imaging lens aberrations, the operative physics of a functioning circuit element, and the circuit element's relative importance and impact on the final product may be included in the mask design database. For example, context specific data can show that an area fill cell's purpose is to help planarize the IC surface; the operative physics is on the order of the magnitude of microns; and the fill cell's impact on the circuit is minimal, except for third-order effects of capacitive parasitic coupling where the area fill cell is within a certain distance of critical interconnects. In a mask design process according to an embodiment of context specific mask inspection, then, an a-priori decision can be made automatically or manually to set data tags associated with the figures describing these contexts and criticalities in the mask database, so that the inspection plan and strategy can adjust the system's resolution and processing accordingly.

At block 308, a resolution and analysis decision process may be applied to set inspection areas on a mask. Mask elements and their related design data may be reviewed and analyzed in their individual contexts, to outline areas or groups of elements on a mask with similar associated inspection priorities and contextual information. For example, a set of area fill cells, with low priority and criticality, may be grouped together for inspection, so that their inspection area is marked for low resolution and fast inspection. Additionally, mask elements may be grouped together based on similar inspection analysis requirements, as discussed with respect to block 314 below. For example, the same set of area fill cells may receive a low analysis, such that even if a defect is found, it is analyzed only in so far as it impacts any circuit elements outside of the set of area fill cells.

The inspection areas may be determined manually or via automatic or computer-aided method by application of criteria and thresholds. In the most general case this may be done through a combination of automated, computer-aided and manual tools. For example, these tools may include critical net timing analysis. Critical nets are those wires and transistors which are the most likely to limit the overall circuit performance. This may also include determining the ensemble of critical nets which, across a process window will impact the overall IC product's yield at the specified performance target. In an embodiment of context specific mask inspection, this data, as well as other a-priori design knowledge, is passed to the processes performed to manufacture the IC, such as mask writing, mask and IC inspection, mask repair, and mask and silicon metrology.

Other semi-automated or manual tools drawn from a toolkit of simulation, analysis, and database access and mining tools, allow regions, cells, blocks or other specific geometric elements to be tagged on the basis of manufacturing needs, historical manufacturing learning, device physics requirements, and system uncertainties, among others. These tags then, according to an embodiment, may travel down stream in the mask flow, and remain available to give context to an efficient and intelligent mask inspection process.

During the analysis of the area inspection resolution, 308, a set of criteria or thresholds (such as those discussed with respect to determining context or priority 306), may be used to place mask elements in the same inspection area based on contextual data such as their function or criticality. The criteria or thresholds may include or be based on, for example: critical timing nets; critical regions, blocks, or cells; less critical regions, blocks or cells, such as a logo or area fill cells; geographic proximity; associations, such as matched transistor pairs; and location criticality, such as crossing of raster stripes.

For example, an area fill cell's purpose may be to help planarize the IC surface. The operative physics may be on the order of the magnitude of microns, and the impact on the circuit may be low, except perhaps for third-order effects of capacitive parasitic coupling, where the area fill cell is within a certain distance of critical interconnects. According to an embodiment of context specific mask inspection, an a-priori decision can be made automatically to set data tags associated with the figures describing these contexts and criticalities in the mask database, to allow the inspection plan and strategy to adjust the system's resolution and processing accordingly.

At block 310, a process for appending or re-ordering mask design data may be applied. For example, enhanced data may be added to or configured in a mask design database to reflect the context and priority of individual mask elements in the mask design or mask inspection plan. The enhanced data may include: an inspection priority and order for each element; information regarding elements that should be matched and inspected in a temporally contiguous manner, such as matched transistors or sense amplifiers in DRAMs; an inspection resolution and analysis for each element; and indicators showing which features are circuit-functional, and which are optical or topological enhancement features. The additional mask design detail would add context information to the polygonal mask shape and layout information contained in mask databases, such as KLARIS.

In an embodiment of context specific mask inspection, a mask may be designed and an inspection file may be developed in blocks 304 through 310 based on a desired integrated circuit, knowledge of the optical and physical effects of a lithography process to be used for imaging the mask to the wafer surface, and device and interconnect physics. A context specific mask design process may produce a mask design database or data file which may include context specific information on each mask element such as dimension, shape, location, priority and circuit function criticality, for example. Thus, rather than a loss of contextual information during the tapeout process, a database with layout and context specific information would be available for a mask design process to re-order the database in light of the context specific information. Additionally, the contextual data may be maintained in a data file for use throughout the mask flow, including the inspection metrology process, for example.

At block 312, mask design features or areas may be inspected on the mask substrate. For example, as shown in FIG. 2, a mask inspection system passes mask design information from a database or set of data files 202, through a network 204, to mask inspection software of an illumination system 206, to control a writing beam 208. The mask design databases or files may be in various formats, including OpenAccess, for example. An expanded and enhanced mask design database, including context specific information, may be provided to a mask inspection process 312 for use in efficiently applying the inspection beam, image capture module, and image analysis module in the functional, manufacturing, and inspection context during an inspection of an individual mask element.

The mask inspection process 312 may include using the contextually enhanced mask design database to direct the inspection process and the associated contextual image analysis. The time expended by the inspection system may be minimized by controlling the viewing order and viewing field of each mask field or element based on the context specific data. Also, the mask inspection process may use the contextual information to control the appropriate resolution and analysis applied to each mask element, based on the context specific priority and order of the mask elements in the mask area. The context specific mask database may be used in applying an inspection beam more efficiently, based on the functional context of an individual element being inspected.

At block 314, any defects found during inspection 312 may be evaluated in relation to context specific mask design data 310. Additionally, a defect's effect may be examined relative to the circuit's context, including such circuit parameters as functionality, criticality and priority, for example. As shown in FIGS. 4a through 4d, which are discussed below, a given defect may have a negative, positive or inconsequential impact on circuit features created from mask elements near the defect. Some mask defects may have no significant negative impact on a circuit produced from the mask, and thus they may be ignored as essentially "non-defects". The "non-defects" may include, for example, defects next to mask elements that do not require exact fidelity to effect their function, such as a logo or an area fill cell. Additionally, some defects may have a positive impact, and thus may be ignored or maintained on the mask. Such "positive defects" may include, for example, a defect located at a distance (for example the Rayleigh distance) from a mask element such that the defect operates to enhance the depth of focus of the lithography for that mask element, such as occurs with scattering bars. Such non-defects and positive defects may be determined not to be defects for purposes of defect analysis or correction. The impact of the defect, whether in terms of circuit functionality, manufacturing yield, reliability or other context may be predicted using various software, predictive algorithms, and simulations that account for the detailed optical, process, and device physics needed to model the influence of the defect.

After the evaluation 314 of found defects, a determination 316 may be made as to the acceptability of each found defect. In blocks 314 and 316, each found defect may be determined within the context of its mask design and inspection data to be acceptable or unacceptable. For example, defects that impact low priority circuit elements or that have a positive impact on nearby mask elements may be determined to be acceptable. As a contrasting example, a defect that negatively impacts a transistor that is critical to the functioning of the circuit may be deemed unacceptable. Depending on the results of the defect evaluation 314 and decision 316, a mask may be corrected or re-written 318, or it may be fully inspected 320 and acceptable for further use.

Photolithographic imaging of mask features in the low-k1 regime can be highly complex. Despite the fact that most defects are sub-resolution, the severe non-linear behavior that occurs in this domain can have a greater or lesser impact than intuition may suggest. This is due to the nature of the dominant physical effects in play. In lithography and inspection processing, these effects include partial-coherence phenomena, scattering by small particles, photoresist exposure, bleaching, and development and plasma etching. In the discrete device sense, effects of transistor device physics and parasitic interconnects may also play a factor. The impact of a defect on the performance, yield, and reliability of an IC product is often important. Repair of the defect may not be warranted, as the defect may have little or no influence, and the repair process may introduce other defects. At other times, a defect in a certain location or associated with specific structure may be so important as to warrant extra care. Therefore, a mask inspection process that considers context specific information may be used to accurately evaluate the mask's defects, and to accurately separate acceptable defects from non-acceptable defects.

FIGS. 4a-d illustrate examples of potential mask defects that may be distinguished by a context specific inspection system used to perform the evaluation and acceptability processes 314 and 316 of FIG. 3. Three basic defect results may be found: fatal, acceptable or improved. These illustrative examples are provided to show the importance of distinguishing the type of defect based on the context of the circuit element or elements impacted by the defect. Mask elements close in size to the wavelength of incident light often cause linear and nonlinear distortions in lithography systems.

Figure 4:
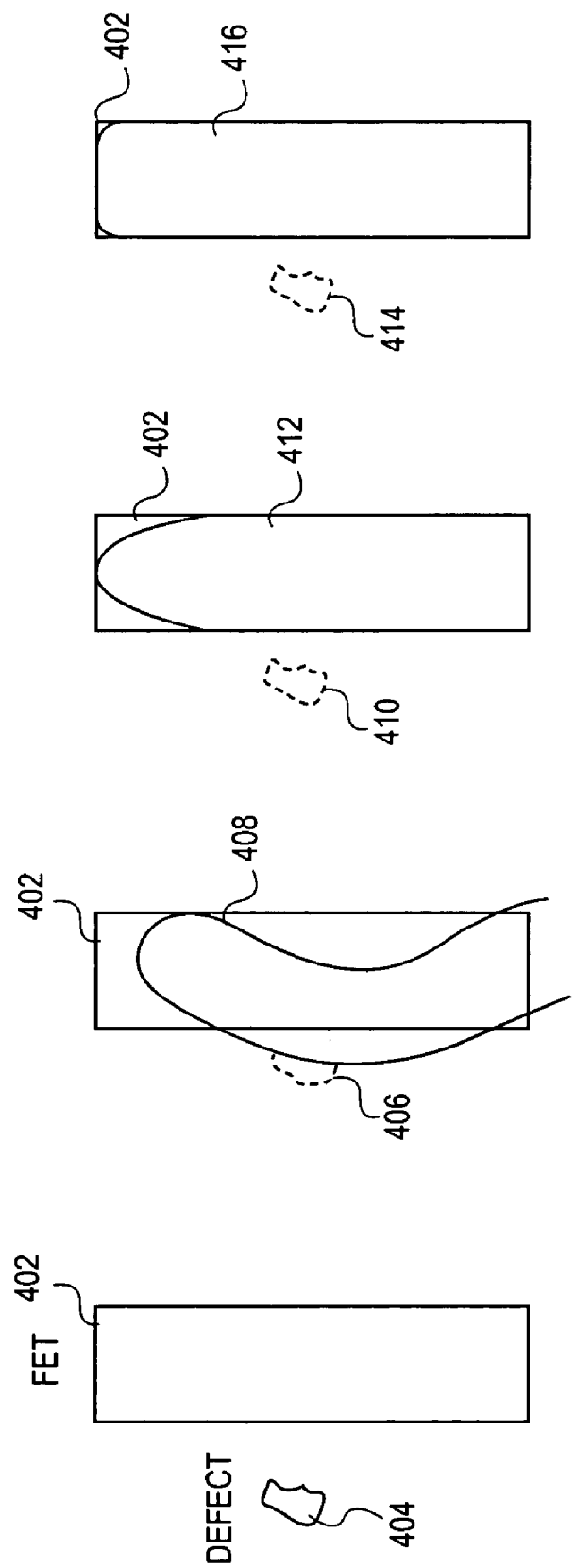
FIGS. 4a, 4b, 4c, and 4d show examples of top views of mask elements and defects overlaid with example resulting circuit layer projections of those mask elements and defects.

FIG. 4a shows an example of a mask element indicative of a FET transistor device 402 with a nearby defect 404 in the mask. The defect 404 may have been found in inspecting the mask during the performance of processes 314 and 316, as discussed above. Alternatively, the defect 404 may be predicted or simulated. FIG. 4b shows a shape 408, over the same FET mask element 402, that may appear at the circuit layer as a result of optical distortions caused by the effects of a nearby defect 406 during the lithography process. The resulting circuit shape 408 may be termed a fatal defect if the circuit element cannot function within acceptable tolerances due to this distorted shape. FIG. 4c shows an example of a shape 412 over the mask element 402 that may appear in the circuit layer as a result of the optical distortions caused by a nearby defect 410. The resulting circuit shape 412 may be deemed acceptable, in spite of the impact of the defect 410, if the deformed circuit element 412 functions within acceptable tolerances. FIG. 4d shows as an overlay on the FET mask element 402 an example of a shape 416 that may appear in the circuit layer as a result of the optical distortions caused by nearby defect 414. The resulting circuit shape 416 may be an improvement over the circuit element expected without the defect 414, and therefore may be acceptable.

The influence of a defect on a feature is therefore not always negative and may not generally be intuitive. For defects close to a feature, and well within a coherence length, the unit of measure, and the unit of interaction distance, are in Rayleigh units (Rayleigh units=lambda/NA, where lambda=the wavelength of the illumination system and NA=the Numerical Aperture of the projection lens respectively). Small opaque additive defects located at a given multiple of the Rayleigh distance (X*lambda/NA) of a feature may cause a distortion of the feature. However, features located at a different multiple of the Rayleigh distance (Y*lambda/NA) from this same feature may actually enhance the feature. Moving further from the feature edge, the distortion rises and drops again periodically with diminishing effect.

Thus, distortions in layout features may not always degrade circuit performance, yield, or reliability. Some processes are inherently self-healing in a sense, because some devices, such a interconnects, may not be perturbed by a small localized deviation, even though the devices might be critical. Other devices might be dramatically impacted by the smallest of distortions. The operative physics which are appropriate for the specific context of a given feature is also considered. The context may be related to the function of the circuit, the manufacturing process, or some other purpose. The criterion for success is therefore different as well. Although the old paradigm of simple rules which were applied uniformly and consistently across a mask had its value during a time when k1 was high and the entanglement of process and device physics and circuit operation were low, this paradigm has become increasingly costly and ineffective. Therefore, the context specific mask inspection process can be used to efficiently determine whether the distortion is severe or relatively harmless.

Figure 5:
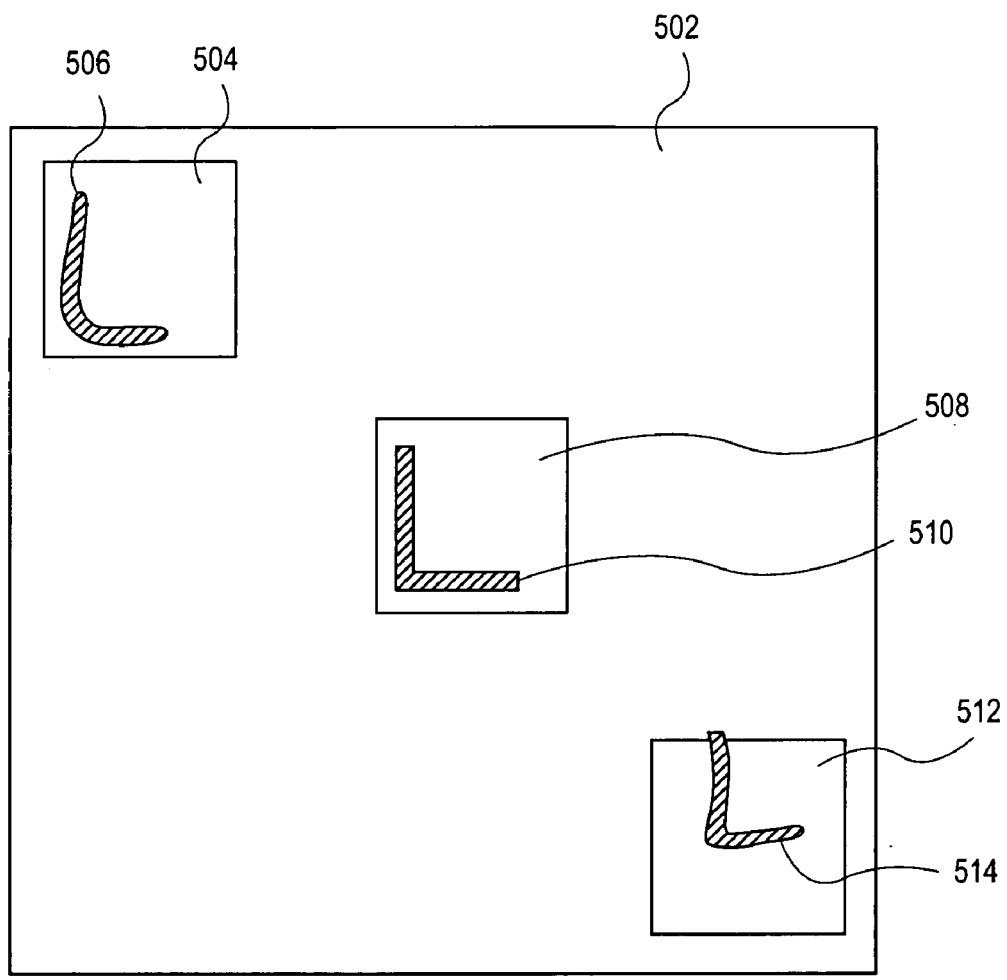
FIG. 5 is a top view of an example of a mask image projected through an imaging lens with aberrations.

FIG. 5 illustrates an example of lithographic imaging lens aberrations as context based factor applied by context specific mask inspection. This factor relates to aberrations and limitations specific to the lithography system being used. Such aberrations may impact mask design and inspection processes, such as processes 306, 308, 312 and 314 shown in FIG. 3, where mask design and inspection plan data are developed and used for inspecting a mask based on context specific data. As the context relates to predicted lithographic effects on a mask in a given lithography system, any system imaging aberrations may impact the predicted and actual images of that mask projected to the circuit layer.

As an example, FIG. 5 shows an IC chip area 502 on a circuit wafer substrate, with sample mask element images 506, 510, 514. The mask element being imaged to be shaped has an ideal shape shown by element 510. In this example of lithographic lens aberrations, the center of the imaging lens system provides an undistorted image as seen by circuit element 510 centered in area 508. However, off the axis or off the center of the imaging field, the imaging lens system has asymmetric aberrations. The aberrations produce circuit elements 506 and 514 in the wrong locations in their respective areas 504 and 512, and with shapes that are distorted from the ideal shape of element 510. An embodiment of context specific mask inspection may use the aberrations of the lithography system when performing the context specific inspection. Predicted circuit images for contextual comparison with a mask and its defects may include parameters and predictions based on the lithography system used, including its imaging lens aberrations. Therefore, the contextual information may be used to compensate for the effects of the lens aberrations, so that the lithography system generates elements 506 and 514 in their proper locations and with proper shapes.

Figure 6:
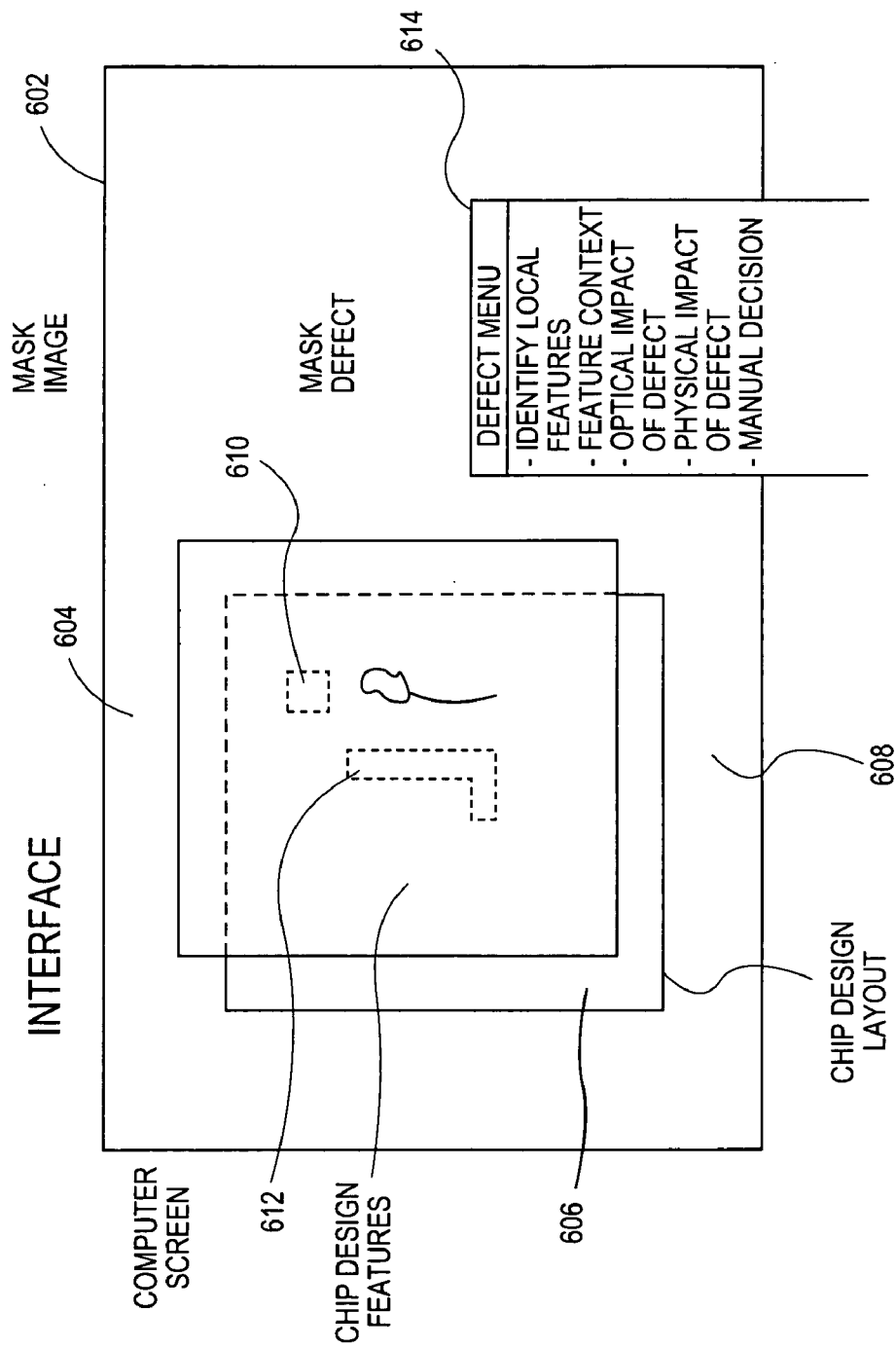
FIG. 6 is an example of a user interface screen in an embodiment of the present invention and FIG. 7 is a top view of an example of a mask with mask elements and search areas thereon.

FIG. 6 illustrates an example of an embodiment of a user interface to be used in the inspection process of context specific mask inspection. An embodiment of such an interface may include mask images 604 produced by scanning electron microscope, optical imaging device, or direct measurements of a mask, with overlaid or adjacent circuit layer images 606 of predicted circuit elements resulting from use of that mask in a photolithography process. A mask defect 608 may be noted on the mask and matched to predicted distortions in the circuit layer image relative to any nearby circuit elements, such as circuit elements 610 and 612, and their associated contextual priority, function, criticality and dimension tolerance data.

An embodiment of this interface may include a menu 614 to be used manually with each mask defect, such as 608, and to offer a system's user various options in inspecting and correcting a mask. For example, the user may be provided with options such as:
  identifying adjacent circuit features;
  obtaining context and priority data for adjacent circuit features from the mask design or circuit design databases;
  evaluating likely optical distortions caused by the defect;
  evaluating the physical impact of the defect on the topology of the resultant circuit level;
  incorporating specific lithography system information, such as imaging lens aberrations; or provided with other actions used in examining and addressing a defect.

Additionally, predetermined criteria may be offered for evaluating various defects. Such an interface may offer the ability to more efficiently evaluate the mask and the resulting circuit within the full context of the related circuit and mask design databases.

An embodiment of context specific mask inspection may be applied to various other processes and technologies, including writing system shaped-beam control, mask and IC metrology, integrated optical circuits (IOC), micro-electro-mechanical systems (MEMS), micro-electro-optic-mechanical systems (MEOMS), further Resolution Enhancement Technologies (RET), electron beam system enhancements such as sub-resolution assist features (SRAF), and maskless electron beam lithography systems. Maskless electron beam or optical lithography may include using electron beam or laser-based systems to write a circuit pattern directly to a wafer without using a photomask or other traditional projection photolithography. Further, embodiments of context specific mask inspection may be applied beyond the design and manufacture of silicon based integrated circuits, to technology such as silicon-on-insulator, silicon-on-sapphire, silicon-germanium, and gallium-arsenide circuits, for example. Furthermore, metrology and other measurement techniques, regardless of dimensionality (1-D, 2-D or 3-D) may also benefit from inspection processes based on context-specific inspection techniques. Therefore, processes, such as context-specific metrology or context-specific atomic force microscopy processes may be implemented with context specific information.

ILLUSTRATIVE EXAMPLE

Figure 7:
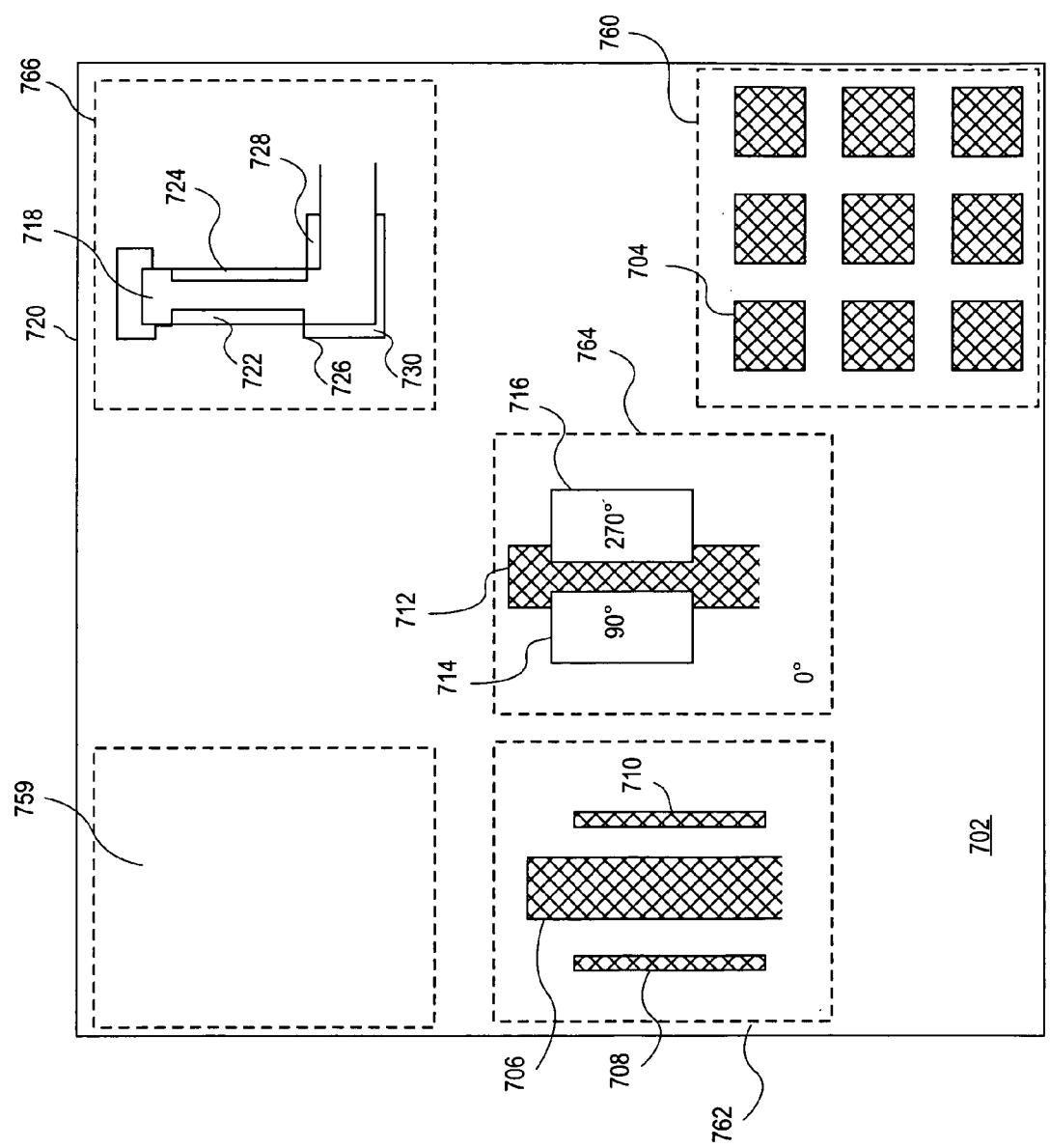

FIG. 7 is offered as an illustrative example of an embodiment of context specific mask inspection. Examples of design data, system processes and inspection area information are provided to help illustrate how such an embodiment may operate. FIG. 7 presents an example of a mask comprised of a glass substrate 702 with various portions, shown by boxed areas 759, 760, 762, 764 and 766, that are examples of mask elements and manufacturing enhancement features. The boxed areas also serve as examples of inspection areas that may have been set manually or via computer-aided process as described above with respect to process 308 of FIG. 3.

Box 759 shows an example of an empty area on a mask 702. For purposes of this illustrative example, it has no physical layout data identified to it. Its mask design context then is assigned the lowest or no priority. The inspection area defined by Box 759 may be labeled for no inspection.

Box 760 shows an example of a set of area fill cells. For this example, assume that the field of box 760 is a clear field, and the photoresist process is a positive tone to allow square patterns 704 to be printed on the silicon. The purpose of the area fill patterns, also called dummy fill or waffle patterns, may be to facilitate planarization through a standard Chemical-Mechanical Polishing (CMP) process. The operative physics domain is one in which the effect of the fill patterns is based upon fluid flow equations, the distributed force of the CMP pad, and other long-range order physics, which are on the order of a very large number of critical feature dimensions. These features, for the most part, are decoupled from the circuit. However, parasitic coupling of interconnect wires to fill cells can make a significant impact on the circuit's performance. Their limiting circuit-wise physics is parasitic capacitive coupling. Small lithographic variations in size, on the order of fractions of a critical dimension, will have no impact on the circuit performance, reliability, or yield. Therefore the area fill cells might be assigned a relatively low overall circuit significance figure of merit, relatively low severity, and relatively low sensitivity to mask errors. Based on this low priority, a higher speed, lower resolution, and lower analysis inspection may occur for box 760. Additionally, Box 760 may define an inspection area with context and priority information, such as low inspection resolution and low inspection analysis.

Box 762 shows an example of an element 706 with scattering bars 708 and 710 intended to improve line-width control and depth of focus. The scattering bars may also provide a degree of optical resolution enhancement as well. For purposes of this illustrative example, element 706 is associated with a MOSFET gate, which is important to the performance of the circuit, and thus is a higher priority element with stringent specifications on its shape, edge definition and fidelity. The scattering bars are also of higher priority because they are placed at a uniform distance parallel to element 706. For this example, assume that the field of 762 is a clear-field chrome-on-glass mask and that the photoresist process is positive tone. Alternatively, if considered a dark-field mask, the dark field could be the partial absorber of an attenuated PSM mask. Additionally, Box 762 may define an inspection area with related context and priority information, such as medium inspection priority and high inspection analysis. The high inspection analysis may be used to distinguish defects based on a direct impact of a defect on transistor element 706, or the indirect impact of a defect on one of the scattering bars 708, 710 to the transistor element 706.

Box 764 shows an example of a 90-degree phase shift region 714 and a 270-degree phase shift region 716 adjacent to a chrome line 712 on a clear field having a 0-degree phase background. The phase shifting areas 714 and 716 are intended to counteract optical distortions that may negatively impact line 712. Here, the element 712 may be associated with a medium critical MOSFET transistor. The operative physical effects, which are considered in the classification and prioritization of these features, are primarily lithographic imaging effects, unique requirements, and effects of single exposure altPSM and short channel MOSFET device physics. Mask patterning error effects in the resulting circuit may be compounded due to the highly non-linear nature of deep sub wavelength lithographic printing, combined with a nonlinear channel-length-to-voltage threshold relationship, for example. Phase shift region size, as well as etch depth and undercut, may be important. For purposes of this illustrative example, element 712 is a high priority element, located in a non-critical mask area, with strict dimensions and location, and high resolution and low analysis specifications. Elements 714 and 716 have lower priority and relatively loose location and dimension requirements. Additionally, Box 764 may define an inspection area with related context and priority information, such as a high inspection priority and low inspection analysis. This inspection context and priority information may be used, because element 712 is a high priority element. Therefore, any defect that impacts it, regardless of how closely it is analyzed, may be considered detrimental.

Box 766 shows an example of a MOSFET gate element 718 with Optical Proximity Correction (OPC) elements 720, 722, 724, 726, 728 and 730. The OPC elements are intended to compensate for Optical Proximity Effect (OPE) distortion around gate element 718. For purposes of this illustrative example, element 718 is a critical mask element associated with a critical circuit function. It is located in a critical circuit area, and has strict dimension and location requirements. OPC elements 720, 722, 724, 726, 728 and 730 have no circuit function and low priority, but are located and shaped within narrow specifications. For purposes of this illustrative example, element 718 has a high priority in a critical area, with strict dimension and location requirements, and high resolution and analysis specifications.

Additionally, Box 766 may define an inspection area with related context and priority information, including high inspection priority and high inspection analysis. This inspection context and priority may be so defined, because element 718 is a high priority element and its OPC elements require exact location. Inspection analysis may be high in this example, because defects may be distinguished based on whether they directly impact the resulting circuit shape or only impact an OPC element in such a way that ultimate circuit function is not effected.

As an alternative example, both Box 764 and Box 766 may be considered as being in one inspection area with high inspection resolution. In that case, the inspection area would have a high inspection resolution, but then it would have sub-areas for the differing inspection analysis areas defined by Box 764 and 766—low and high analysis, respectively, as described above.

By way of one example of an embodiment, boxed area 759 of FIG. 7 demonstrates an empty area on a mask substrate 702. Alternatively, Box 759 may contain some very low priority mask elements, such as a circuit logo or other non-functional elements. Consider then that Box 759 has little or no design information or contextual parameters identified to it, or at least that any contextual parameters for elements in Box 759 are of the lowest contextual priority. As such, it may then be labeled as a no inspection area, or some such similar label to indicate that its low priority does not require inspection for defects. It should be noted however that in general a defect in this region may cause circuit impact or process impact if it is large enough. Parasitic interactions may occur with overlying wires or with adjacent features. This may be addressed by specifying a resolution that is suitably fine to capture any circuit- or process-perturbing defects in inspection and to interpret the defects carefully and in the appropriate circuit or processing context, if they satisfy conditions that warrant it. This may be done by use of tables which match conditions to a response rule or tolerance as the subsequent examples show.

With these example contextual parameters in mind, and referring to FIGS. 3 and 7, an embodiment applied to this example may employ the following methods and systems to improve a mask inspection process. Considering Box 759 to be empty space for this example, Box 759 may then have no mask design process 302 applied to it directly, and thus no polygonal shape, location, orientation or context information identified to it in data elements in mask design information 304.

With such limited or non-existent design data for Box area 759, analysis block 306 may be limited. Any context or design information for Box 759, or the fact that there is no such information, may be evaluated and its mask priority determined manually or by a computer-aided automated process. In such an analysis block 306, as an empty space, no analysis may occur as no data is available to be analyzed or compared to criteria for priority, criticality, dimensions, location, and sensitivity to defects, among others, either to determine its inspection context and priority relative to the rest of the mask elements. It should be noted however that in general a defect in this area 759 may cause circuit impact or process impact if it is large enough. Parasitic interactions may occur with overlying wires or with adjacent features, and thus some analysis 306 may be applied to evaluate such potential effects. Thus, analysis block 306 may determine in what order Box 759 may or may not be inspected and with what resolution and analysis, if any.

Context and priority analysis 306 data may then pass to an inspection area analysis module 308, wherein individual mask element data may be examined with adjacent or nearby mask elements to determine potential grouping of mask elements into inspection areas with similar inspection or analysis parameters. This analysis 308 may be done manually or by an automated process applying various criteria. In such an analysis block 408, Box 859 may be defined as an inspection area, as no mask elements exist therein. It may then be labeled as a no inspection area, or some such similar label to indicate its lowest contextual priority and a decision not to inspect that area.

Context and priority analysis 306 data and inspection area parameters 308 may then be appended to or configured in block 310 to the initial design data 302 for the inspection area defined by Box 759. In this example, this would mean that Box 759 would have the above location, context and inspection information identified together. Specifically, based on the example context information for Box 759 above, data may be appended to or configured in the design data to reflect the context and priority of inspection area 859 in a plan for inspecting the mask. As an example, the design or inspection file may contain various fields and identifiers for Box 759, such as:

Circuit function=None (where the potential values or identifiers may include, for example: None, MOSFET, Critical Signal Interconnect, Power, or Logo);

Circuit Function Priority=None (where the potential values or identifiers may include, for example: None, Low, Medium or High);

Circuit Criticality=none (where the potential values or identifiers may include, for example: None, low, medium or critical);

Inspection Resolution=None (where the potential values or identifiers may include, for example: none, low, medium or high);

Inspection Analysis=None (where the potential values or identifiers may include, for example: none, low, medium or high);

Relative Mask Priority=none (where the potential values or identifiers may include, for example: none, low, medium or high);

Process Purpose=None (where the potential values or identifiers may include, for example: CMP fill mask, Critical feature mask, OPC feature, PSM feature, assist feature, or none);

Critical Processes (inferred Physics): None (where the potential values or identifiers may include, for example: CMP, Lithography, mask, or none);

Dimension and Shape Fidelity=none (where the potential values or identifiers may include, for example: none, low, medium or high);

Relative Location Importance=Low (where the potential values or identifiers may include, for example: low, medium or high);

Circuit Value=None (where the potential values or identifiers may include, for example: none, low, medium or high);

Inspection Tips?=No (where the potential values or identifiers may include, for example: yes or no, with notes if necessary). No specific format or terminology is required. For example, a different scale or other quantitative or qualitative values may be used.

This enhanced mask design data may be used by a mask inspection system 312 to more efficiently apply an inspection beam and image capture and analysis to a mask substrate in accordance with said context and priority. For example, the mask inspection system 312, may be directed to apply no time, energy or analysis to Box 759. In this way, the inspection system 312 may operate more quickly and efficiently in avoiding inspection of empty or lowest priority mask areas. Alternatively, if there is concern for potential defects in Box 759 causing circuit or process impact on adjacent areas, then a resolution may be specified that is suitably fine to capture any circuit- or process-perturbing defects in inspection and to interpret the defects carefully and in the appropriate circuit or processing context if they satisfy conditions that warrant it.

By way of another example of an embodiment, boxed area 760 of FIG. 7 demonstrates a plurality of area fill cell shapes, one of which is 704, on a mask substrate 702. Consider if the example fill cell 704 were placed in a non-critical area of a circuit solely to fill space. Consider further element 704 to have various associated contextual parameters for intelligent mask inspection, including: very low priority; non-critical dimensions and location; high tolerance to mask write defects; low inspection resolution; and low inspection analysis. Fill cells such as 704 may be added to a mask to produce a set of structures on a chip that are not part of the electrical operation of the circuit, but rather to improve the topographical planarization and spatial homogeneity of that circuit layer.

With these example contextual parameters in mind, and referring to FIGS. 3 and 7, an embodiment applied to this example may employ the following methods and systems to improve the mask inspection process. Mask element 704 and the other fill cells in boxed area 760 may be designed in an IC design process 302. Focusing on element 704, its polygonal shape, location, orientation and context information, for example, its resulting circuit element's function and criticality, may be described by a plurality of data elements in data file 304 maintained in a database on computer readable media such as a hard disk and passed via software or hardware, or often over an internet connection in, for example, ftp format, to a mask inspection design process 306-310. Specifically, mask element 704 and its contextual information may then pass to an analysis block 306, wherein its context may be evaluated and its mask inspection priority, resolution and analysis level determined manually or by a computer-aided automated process. In such an analysis block 306, as a very low-level priority element in a non-critical mask area, standard inspection system parameters and tolerances may be applied with little further analysis. Alternatively, criteria for priority, criticality, dimensions, location, and sensitivity to defects, among others, may be applied to data for 704 manually or via automated process of comparison to determine its inspection context and priority relative to other mask elements. In other words, analysis block 306 will determine in what order 704 may be inspected and with what resolution and analysis.

Context and priority analysis 306 data may then pass to an inspection area analysis module 308, wherein individual mask element data may be examined with adjacent or nearby mask elements to determine potential groupings of mask elements into inspection areas with similar inspection parameters. This analysis 308 may be done manually or by an automated or computer-aided process applying various criteria. In such an analysis block 308, area fill cells 704 may be grouped together in an inspection area defined by Box 760, as mask elements with the same low inspection resolution and analysis context.

Context and priority analysis data 306 and inspection area analysis data 308 may then be appended to or configured in block 310 to the initial design data 302 for mask element 704. In this example, this would mean that mask element 704 would have its polygonal, location and context information identified together, and additionally may be identified together with the other fill cells in Box 760 as part of the same inspection area. Specifically, based on the example context information for 704 above, data may be appended to or configured in the design data to reflect the context, priority, resolution, analysis and inspection area of element 704 in the inspection plan for the mask. As an example, the design file may contain various fields and identifiers, such as:

Circuit function=None;
    Circuit Function Priority=Low;
    Circuit Criticality=none;
    Inspection Resolution=Low;
    Inspection Analysis=Low;
    Relative Mask Priority=none;
    Process Purpose=CMP fill mask;
    Critical Processes (inferred Physics): CMP;
    Dimension and Shape Fidelity=low;
    Relative Location Importance=Low;
    Circuit Value=Low;
    Inspection Tips?=No;
    Inspection Area=Yes, Area 760 (where the potential values or identifiers may include, for example: yes or no, with an inspection area identifier).

No specific format or terminology is required. For example, a different scale or other quantitative or qualitative values may be used. See text accompanying area 759 above for further example field values for the various example identifier categories above. Additionally, the database may be re-ordered to place data for area 760 in an area or order within the mask database wherein it may be most efficiently and effectively retrieved.

This enhanced mask design data may be used by a mask inspection system 312 to more efficiently apply an inspection beam and image capture and analysis to a mask substrate in accordance with said context and priority. For example, the mask inspection system 312, may be directed to apply as little time, energy and resolution to area fill cell 704 as possible, and to inspect such elements after other elements have been completed. Element 704 would be inspected for example after high priority elements (such as those in boxed areas 764 and 766) may have been inspected with greater resolution and higher analysis. In this way, if unacceptable defects are found in a higher priority inspection area or element, such as Box 766 for example, inspection may cease immediately, while a decision process 316 is performed to determine whether to repair or re-write the mask 318.

Due to its low priority, element 704 may be inspected with standard inspection system parameters and tolerances, and not any of the tailored requirements shown in the following examples. With these parameters, the inspection system can devote it's resources to traversing down a hierarchical tree of potential chip killing defect regions, wherein if defects are found they may have the greatest likelihood of causing catastrophic circuit or process failure. In the event that a defect is in fact found, knowledge of the operative physics of how that defect interacts with the feature and what the impact of the perturbation in the circuit or process may be available.

Simple rules of feature defect and fidelity tolerances as shown in the table below may provide additional screening for excluding non-impacting defects, while other rules may specify the true severity of the defect according to its circuit or process context. By analogy to design rule checking a layout, various conditions and assigned tolerance rules allow a mask inspection or metrology system to apply only as stringent a tolerance rules allow a mask inspection or metrology system to apply only as stringent a tolerance as is needed for the specific purpose (i.e. circuit or manufacturing purposes).

| I. Region 760 | | | | | |
|---|---|---|---|---|---|
| Process Purpose: | LEM (Layout Enhancement for Manufacturability) Features | CMP | | | |
| Process Impact of Defect: | Rule 1 None | Rule 2 None | Rule 3 BAD | Rule 4 None | Rule 5 Unknown |
| Circuit Purpose: | None | | | | |
| Circuit Impact of Defect: | C-1 None | C-2 None | C-3 None | C-4 None | C-5 BAD |
| Inspection Resolution | X nm | | | | |

Appropriate analysis, performed either automatically or manually using a defect analysis workstation, with embedded process and device physics TCAD tools, or with circuit analysis tools, may then be used to classify the defect as one which requires repair, can be waived, or is non-repairable.

By way of further example, boxed area 762 of FIG. 7 shows a MOSFET gate 706 with nearby scattering bars 708 and 710. Consider if the mask element 706 were an important, but not critical, connector element for the operation of the resulting circuit. Consider element 706 to have various associated contextual parameters for intelligent mask inspection, including: medium-level priority; a relatively simple shape; location in a non-critical area of the circuit; specific requirements for definiteness, straightness and uniformity; low tolerance for mask write defects; medium-level inspection resolution; and high inspection analysis requirements. Elements 708 and 710 are set at a distance calculated to produce optical effects around the mask element improving the line-width control and depth of focus of the photolithography system at the wafer surface. Scattering bars 708 and 710 may be given high priority, because their misplacement or defects in their shape may have a significant negative impact on the functional mask element 706 or other elements of the circuit. Consider elements 708 and 710 to have various associated contextual parameters, including: high priority and strict dimension, location and relative orientation requirements; medium-level inspection resolution; high inspection analysis requirements; and no circuit function.

With these example contextual parameters in mind, and referring to FIGS. 3 and 7, an embodiment applied to this example may employ the following methods and systems to improve the mask inspection process. Mask element 706 and scattering bars 708 and 710 may be designed in an IC design process 302. Focusing on element 706, its polygonal shape, location, orientation and context information, such as its resulting circuit element's function and criticality, may be described by a plurality of data elements in a data file 304. The data file may be maintained in a database on computer readable media, such as a hard disk, and passed via software or hardware, or often over an internet connection in, for example, ftp format, to mask inspection design processes such as processes 306 through 310.

Specifically, mask element 706 and its contextual information may then pass to an analysis block 306, wherein its context may be evaluated and its mask inspection priority, resolution and analysis level may be determined manually or by a computer-aided automated process. The analysis process 306 uses the context specific information to identify mask element 706 as a medium-level priority element. The process 306 then applies standard inspection system and analysis parameters during the analysis. Alternatively, criteria for priority, criticality, dimensions location, and sensitivity to defects, among others, may be applied to element 706, either manually or via an automated process of comparison, to determine its inspection context and priority relative to other mask elements. In other words, analysis block 306 may determine in what order 706 will be inspected and with what resolution and analysis.

Context and priority analysis data 306 may then pass to an inspection area analysis module 308, wherein individual mask element data may be examined with adjacent or nearby mask elements to determine potential groupings of mask elements into inspection areas with similar inspection parameters. This analysis 308 may be done manually or by an automated or computer-aided process applying various criteria. In such an analysis block 308, line element 706 and scattering bars 708 and 710 may be grouped together in an inspection area defined by Box 762, as mask elements with the same medium inspection resolution and high inspection analysis context. Other adjacent mask elements with similar contextual inspection requirements may also be included.

Context and priority analysis data 306 and inspection area data 308 may then be appended to or configured in block 308 to the initial design data 302 for mask element 706. In this example, this would mean that mask element 706 would be identified with its dimension, location, context and priority data, such that said mask element 706 is distinguished from such other elements as scattering bars 708 and 710. Additionally, mask element 706 may be identified together with other elements in its inspection area 762.

Specifically, based on the example context information above, data may be appended to or configured in the design data to reflect the context and priority of element 706 in the plan to inspect the mask. As an example, the design file may contain various fields and identifiers for 706, such as:

Circuit function=MOSFET;
Circuit Function Priority Medium;
Circuit Criticality=Medium;
Inspection Resolution=Medium;
Inspection Analysis=High;
Relative Mask Priority=Medium;
Process Purpose=functional mask feature;
Critical Processes (inferred Physics): lithography;
Dimension and Shape Fidelity=High;
Relative Location Importance=Medium;
Circuit Value=Medium;
Inspection Tips?=Yes, inspect 708 and 710 contemporaneously as they are matched;
Inspection Area=Yes, Area 762.

No specific format or terminology is required. For example, a different scale or other quantitative or qualitative values may be used. See text accompanying area 759 above for further example field values for the various example identifier categories above.

Additionally, scattering bars 708 and 710 may also have their own individual data with similar data fields and values reflecting their function, criticality and other associated contextual data, such as, for example:

Relative Mask Priority=High;
Circuit function=None;
Process Purpose=OPC;
Dimension and Shape Fidelity=High;
Relative Location Importance=High;
Inspection Resolution=Medium; and
Inspection analysis=High;
Inspection Area=Yes, Area 762.

Additionally, the database may be re-ordered to place data for area 762 in an area or order within the mask database wherein it may be most efficiently and effectively retrieved.

This enhanced mask design and inspection plan data may be used by a mask inspection system 312 to more efficiently apply an inspection beam and image capture and analysis to a mask substrate in accordance with said context and priority. For example, the mask inspection system 312, may be directed to apply as much or more time, energy and resolution to scattering bars 708 and 710 as to the functional element 706, because of the high priority they are given. Per the inspection tip, elements 708 and 710 may be inspected together. Additionally, element 706 may be inspected after other higher priority elements (such as those in boxed areas 764 or 766), as 706 is important, but not critical, and of medium mask priority.

In this way, if unacceptable defects are found in a higher priority inspection area, such as Box 766 for example, inspection may cease immediately for a decision 316 on whether to correct or re-write the mask 318. Element 706 may also be inspected more quickly or with less energy than higher priority elements or inspection areas. With these parameters, the inspection system may devote its resources to traversing down a hierarchical tree of potential chip killing defect regions, wherein if defect are found they may have the greatest likelihood of catastrophic circuit or process failure. In the event that a defect is found, knowledge of the operative physics of how that defect interacts with the feature and the impact of the perturbation in the circuit or process may be available.

Simple rules of feature defect and fidelity tolerances, as shown in the table below, may provide additional screening for excluding non-impacting defects, while other rules may specify the true severity of the defect according to its circuit or process context. By analogy to design rule checking a layout, various conditions and assigned tolerance rules allow a mask inspection or metrology system to apply only as stringent a tolerance as is needed for the specific purpose (i.e. circuit or manufacturing purposes).

| | Region 762 Feature 706 | | | | |
|---|---|---|---|---|---|
| Process Purpose: | None | | | | |
| Process Impact of Defect: | Rule 1 None | Rule 2 None | Rule 3 BAD | Rule 4 None | Rule 5 Unknown |
| Circuit Purpose: | MOSFET Gate | | | | |
| Circuit Impact of Defect: | C-1 None | C-2 None | C-3 None | C-4 None | C-5 BAD |
| Inspection Resolution | X nm | | | | |

Appropriate analysis either automatically or manually using a defect analysis workstation with embedded process and device physics TCAD tools as well as circuit analysis tools may then be used to classify the defect as one which requires repair, can be waived, or is non-repairable.

By way of another example of an embodiment, boxed area 764 of FIG. 7 shows a mask element 512 intended to produce en a circuit wafer a functional transistor element, such as a MOSFET transistor, that is important, and of medium criticality, to the functioning of the circuit. Consider if element 712 were to have various associated contextual design parameters for intelligent mask writing, including: high priority; fine dimension specifications; a location in a non-critical area of the circuit; medium fidelity tolerances; mid-range sensitivity to mask writing defects; high inspection resolution; and medium inspection analysis.

Elements 714 and 716 are Phase Shifting Mask (PSM) features for element 712-714 and 716 having 90-degree and 270-degree phase shifting properties, respectively. Such PSM features may be added to alter the phase of the light passing on at least one side of a mask feature in order to control optical interference phenomena such that the resolution and depth of focus of the resultant image is improved at the wafer surface. Consider these PSM elements to have their own various associated contextual design parameters, such as: low priority; low fidelity requirements; low sensitivity to mask writing defects, high inspection resolution, low inspection analysis, and no circuit function.

With the above example contextual parameters in mind, and referring to FIGS. 3 and 7, an embodiment applied to this example may employ the following methods and systems to improve a mask inspection process. Mask element 712 and the PSM features 714 and 716 may be designed in an IC design process 302. The polygonal shape data for 712, along with location, orientation and other context information—for example the circuit element's function and criticality—may be described by a plurality of data elements in data file 304 maintained in computer readable media, such as a hard disk, and passed via software or hardware, or over the internet via ftp protocol, for example, to a mask design process 306-310.

Specifically, mask element 512 and its contextual information may be passed to an analysis block 306, wherein its context may be evaluated and its priority determined manually or by a computer-aided automated process. In this analysis block 306, as a high priority element, criteria for priority, criticality, dimensions, location, and sensitivity to defects, among others, may be applied to 712 manually or via automated process of comparison to determine that element's mask inspection context and priority relative to other mask elements. In other words, block 306 may determine in what order and with what resolution and analysis element 712 may be inspected.

Context and priority analysis 306 data may then pass to an inspection area analysis module 408, wherein individual mask element data may be examined with adjacent or nearby mask elements to determine potential groupings of mask elements into inspection areas with similar inspection parameters. This analysis 408 may be done manually or by an automated process applying various criteria. In such an analysis block 308, line element 712 and PSM elements 714 and 716 may be grouped together in an inspection area defined by Box 764, as mask elements with the same high inspection resolution and medium inspection analysis context. Other adjacent mask elements with similar contextual inspection requirements may also be included.

Context and priority analysis data 306 and inspection area data 308 may be appended to or configured in block 310 to the initial design data 302 for said mask element 712. In this example, this would mean that mask element 712 would be identified with its polygonal, location, context and priority data, such that said mask element 712 is distinguished from and prioritized more highly than its adjacent PSM elements 714 and 716. Additionally, mask element 712 may be identified together with the other elements in its inspection area 764.

Specifically, based on the example context information for 712 above, data may be appended to or configured in the mask design data to reflect the context and priority of element 712 and to operate as a contextual inspection plan for inspecting the mask. As an example, the design file may contain various data fields and identifiers for 712, such as:

Circuit function=MOSFET;
Circuit Function Priority=High;
Circuit Criticality=Medium;
Relative Mask Priority=Medium;
Process Purpose=functional mask feature;
Critical Processes (inferred Physics): lithography; Inspection Resolution=High;
Inspection Analysis=Low; Dimension and Shape Fidelity=High;
Relative Location Importance=Medium; Circuit Value=Medium;
Inspection Tips?=No;
Inspection Area=Yes, Area 764.

See text accompanying area 759 above for further example field values for the various example identifier categories above. Additionally, PSM features 714 and 716 may have their own individual data above with similar data fields and values reflecting their function, criticality and other associated contextual data, such as, for example:

Circuit function=None;
Circuit Function Priority=Low;
Circuit Criticality=None;
Process Purpose=PSM feature;
Critical Processes (inferred Physics): lithography;
Inspection Resolution. =High;
Inspection Analysis=Low;
Inspection Area=Yes, Area 764.

No specific format or terminology is required. For, example, a different scale or other quantitative or qualitative values may be used. Additionally, the database may be re-ordered to place data for area 764 in an area or order within the mask database wherein it may be most efficiently and effectively retrieved.

The enhanced mask design data may be used by a mask inspection system 312 to more efficiently apply an inspection beam and image capture and analysis to a mask substrate in accordance with said context, priority, enhancement features and beam shape. For example, element 712 may be inspected after other higher priority elements (such as those in boxed area 766), as 712 is of medium priority and is important, but less critical than 766. In this way, if unacceptable defects are found in the higher priority areas, the inspection may cease immediately for an analysis 314 and decision 316 as to whether to continue or start over by writing a new mask. Element 712 may also be inspected more quickly than higher priority elements.

Furthermore, based on the distinction between a functional mask element 712 and lower priority elements, such as PSM features 714 and 716, the mask inspection system 312 may be directed to apply more time and a higher resolution to element 712. In the context of mask element 712 and the desired circuit, those PSM features serve only to improve the depth of focus of the lithography system for functional element 712, and their value follows from their impact on that element 712. PSM elements 714 and 716 may then be written with less resolution or analysis.

With these parameters, the inspection system may devote its resources to traversing down a hierarchical tree of potential chip killing defect regions, wherein if defects are found they may have the greatest likelihood of catastrophic circuit or process failure. In the event that a defect is found, knowledge of the operative physics of how that defect interacts with the feature and the impact of the perturbation in the circuit or process may be available. Simple rules similar to the tables above for areas 760 and 762, provide additional screening for excluding non-impacting defects while other rules specify the true severity of the defect and in which circuit or process context. Appropriate analysis either automatically or manually using a defect analysis workstation with embedded process and device physics TCAD tools as well as circuit analysis tools may then be used to classify the defect as one which requires repair, can be waived, or is non-repairable.

By way of a final example of an embodiment of context specific mask inspection, the boxed area at 766 in FIG. 7 shows a mask element 718 intended to produce on a circuit wafer a functional transistor element (for example, a MOSFET gate) that is critical to the ultimate functioning of the circuit. Consider if element 718 were to have various associated contextual parameters for intelligent mask writing, including: high priority; fine dimensions; location in a critical area of the circuit; high fidelity specifications; high sensitivity to mask writing defects; and high inspection resolution and analysis requirements. Elements 720, 722, 724, 726, 728 and 730 are Optical Proximity Correction (OPC) features for element 718 on a mask substrate 702. Such additional features may be used to pre-distort a mask element such that the transmission of light around the element produces an improved image of the intended circuit element at the wafer surface. Consider these OPC elements to have various associated contextual parameters, including: medium priority and strict dimension and location specifications, medium inspection resolution, and high inspection analysis, but no circuit function.

With the above example contextual parameters in mind, and referring to FIGS. 3 and 7, an embodiment applied to this example may employ the following methods and systems to improve the mask inspection process. Mask element 718 and its OPC features (720-730) may be designed in an IC design process 302. Focusing on element 718, its polygonal shape, location, orientation and other context information—for example the circuit element's function, criticality and priority—may be described by a plurality of data elements in a data file 304 maintained in computer readable media, such as a hard disk, and passed via software or hardware, or often over the internet via ftp protocol, for example, to mask design processes 306 through 310.

The mask element 718 and its contextual information may then pass to an analysis block 306, wherein its context may be evaluated and its mask inspection priority determined manually or by a computer-aided automated process. In such an analysis block 306, as a high priority element, criteria for priority, criticality, dimensions, location, and sensitivity to defects, among others, may be applied to 718 manually or via automated process of comparison to determine its mask inspection context and priority relative to the other mask elements. In other words, block 306 may determine in what order and with what precision 718 may be written.

Context and priority analysis 306 data may then pass to an inspection area analysis module 308, wherein individual mask element data may be examined with adjacent or nearby mask elements to determine potential groupings of mask elements into inspection areas with similar inspection parameters. This analysis 408 may be done manually or by an automated process applying various criteria. In such an analysis block 308, line element 718 and OPC elements 720, 722, 724, 726, 728, and 730 may be grouped together in an inspection area defined by Box 766, as mask elements with similar high inspection analysis context and medium to high inspection resolution parameters. Alternatively, other adjacent mask elements with similar contextual inspection requirements, such as Box 764, may be included in the same inspection area. In such an alternative example, boxes 764 and 766 might be considered one inspection area due to their similar inspection resolution requirements, even if sub-areas for Box 764 and Box 766 are maintained due to differing inspection analysis needs.

Context and priority analysis data 306 and area inspection data 308 may be appended to or configured in 308 to the initial design data 302 for said mask element 718. In this example, this would mean that mask element 718 would be identified together with its dimension, location, context and priority data, such that said mask element 718 is distinguished from such other mask features as the OPC elements 720-730.

Specifically, based on the example context information above, data may be appended to or configured in the design data to reflect the context and priority of element 718 in the inspection plan to inspect the mask. As an example, the design file may contain various data fields and identifiers for 718, such as:

Circuit function=MOSFET;
Circuit Function Priority=High;
Circuit Criticality=High;
Relative Mask Priority=High;
Process Purpose=functional mask feature;
Critical Processes (inferred Physics): lithography;
Inspection Resolution=High;
Inspection Analysis=High;
Dimension and Shape Fidelity=High;
Relative Location Importance=High;
Circuit Value=High;
Inspection Tips?=Yes, inspect contemporaneously with OPC 720-730;
Inspection Area=Yes, Area 766.

See text accompanying area 759 above for further example field values. Additionally, OPC features 520-530 may have their own individual data above with similar data fields and values reflecting their function, criticality and other associated contextual data, such as, for example:

Circuit function=None;
Circuit Function Priority=Low;
Circuit Criticality=None;
Process Purpose=OPC feature;
Critical Processes (inferred Physics): lithography;
Inspection Resolution=High;
Inspection Analysis=High.

Additionally, the database may be re-ordered to place data for area 766 in an area or order within the mask database wherein it may be most efficiently and effectively retrieved.

This enhanced mask design data may be used by a mask inspection system 312 to more efficiently apply an inspection beam to a mask substrate in accordance with said context, priority, resolution, and analysis. For example, element 718 may be inspected first, with highest resolution and a slow beam trajectory, because of its critical circuit value and high priority relative to other mask elements. In this way, if unacceptable defects are found, the inspection may cease immediately for a an analysis 314 and decision 316 as to whether to continue or start over by writing a new mask.

Furthermore, distinguishing between the high priority of element 718 and the relatively lower or secondary priority of OPC features 720 730, the mask inspection system may be directed to focus more time and resolution on the functional element 718 than on the OPC features. In the context of the mask element 718 and the desired circuit, those features serve only to improve the fidelity of the functional element 718, and their value follows from their impact on that element 718.

With these parameters, the inspection system may devote its resources to traversing down a hierarchical tree of potential chip killing defect regions, wherein if defect are found they may have the greatest likelihood of catastrophic circuit or process failure. In the event that a defect is found, knowledge of the operative physics of how that defect interacts with the feature and the impact of the perturbation in the circuit or process may be available. Simple rules similar to the tables above for areas 760 and 762, provide additional screening for excluding non-impacting defects while other rules specify the true severity of the defect and in which circuit or process context.

Appropriate analysis either automatically or manually using a defect analysis workstation with embedded process and device physics CAD tools as well as circuit analysis tools may then be used to classify the defect as one which requires repair, can be waived, or is non-repairable. For this example overall, then, contextual and priority data for the various mask elements may be evaluated to produce a plan for inspecting a mask in a more efficient manner. Specifically, the resultant mask design file and inspection plan may be configured to direct the inspection beam and image capture and analysis accordingly.

Using the maximum time, energy and resolution, the following elements may be inspected in order: 718, 720-730, 708 and 710 matched, 712, and 706, with inspection resolution being reduced for 720-730 and 708 and 710. Additionally, differing analysis may be applied accordingly, such that elements 718, 720-730, 708 and 710, 712 and 706 receive higher analysis for any defects that may impact those features. Following those and at a lower resolution, a faster beam traverse rate and a wider image field, if available, the following elements may be inspected in order: 714, 716 and 704. Differing analysis may be applied such that elements 714 and 716 receive higher analysis in context, and element 704 receives little or no analysis of any defects affecting it. Finally, as a no inspect area, Box 759 may simply not be inspected. In such a hierarchy of inspection resolution and analysis, defects impacting critical mask elements may be found early in the inspection process and addressed accordingly, such that lower priority elements do not receive undue resolution, analysis or time.

Embodiments of context specific mask inspection applied to mask inspection may include the following:

Identification and annotation of the feature purpose—what the physical element is in the context of the circuit purpose—by relating the polygon to design. The physical circuit properties and associated netlist properties may be forward annotated onto the layout if there is a circuit purpose. The same identification/annotation may be done for the context of the manufacturing purpose.

Identification of the physical mechanisms being probed should there be a defect or a distortion of the feature.

Identification of the criticality of the element in the context of the circuit or manufacturing purpose.

Given the a-priori knowledge of the future potential impact a defect may have on the IC, intelligent decisions may be made as to whether an artifact should be classified as a defect or not, and if so the severity of it.

This image-understanding approach may provide sufficient information for a decision to be made as to whether to waive the defect, repair the defect, or write a new mask. For example, for a matched pair of transistors such as in a sense amplifier of a DRAM circuit, the 'image' might well be one of threshold voltage and linearity matching of the two transistors rather than geometrical exactitude.

FIGS. 8A through 8G show examples of information provided by considering design features with respect to the context of the design. This context information, which may be used to identify critical features, is significantly more useful than labeling each design feature with a tag that provides no indication as to why or how the feature is critical. The element is a via, represented as a larger square on a first layer and a smaller square on a second layer. The context of the via can be used to identify which features of the via are critical. A fabrication rule may state that the via is completely enclosed by the first layer, even in the presence of process uncertainty. The smaller square on the second layer may be in different locations relative to the larger square on the first layer.

Figure 8A:
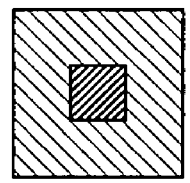
FIGS. 8A through 8G show examples of information provided by considering design features with respect to the context of the design.
Figure 8B:
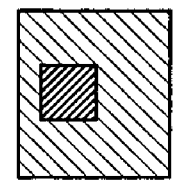
Figure 8C:
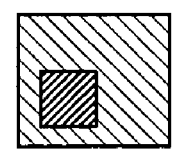
Figure 8D:
Figure 8E:
Figure 8F:
Figure 8G:
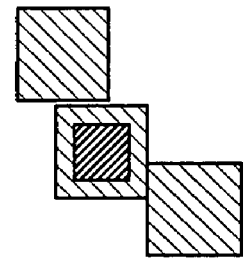

For the embodiment of FIG. 8A, the placements of the sides are not critical. As shown in FIG. 8B, one side is critical. In FIGS. 8C and 8D, two sides are critical. FIG. 8E shows an example having three sides that are critical. In FIG. 8F, placement of all four sides is critical. In FIG. 8G, portions of some edges are critical and others are not.

The vias themselves, and some of the constraints (such as minimum area for example), are identical in FIGS. 8A through 8F However, whether the edge placement is critical (and hence worth the cost of providing increased accuracy during the mask writing, or is rejected as a defect during the mask inspection), may not be determined from the fact that the figure represents a via, or by marking the via as critical. Rather, the context information may be used to determine the critical and non-critical features of the via. In this case, the context information could be used to individually mark each edge as critical or non-critical.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A method for inspecting a mask having a plurality of mask elements, the method comprising:
generating integrated circuit design data and using information for interfeature relationships of the integrated circuit design data to provide contextual information for elements within the integrated circuit design, the contextual information comprising priority, ordering or inspection parameter information of the mask elements; using the contextual information to guide inspection of the mask, wherein analysis is performed to allocate mask inspection resources commensurate with the design or manufacturing specific context of the elements within the integrated circuit design data; and inspecting the mask using mask inspection resources allocated based upon the contextual information, wherein mask resources are allocated based upon the contextual information by adjusting the power, size, shape, order, resolution, or timing of an inspection beam.

2. The method of claim 1, wherein the interfeature relationships are on one layer of the integrated circuit design.

3. The method of claim 1, wherein the interfeature relationships are across multiple layers of the integrated circuit design.

4. The method of claim 1, wherein the interfeature relationships comprise:
interfeature process proximity effects;
interfeature coupling across layers;
interfeature electronic relationships; or
wire interconnects longer than a given length.

5. The method of claim 1, wherein the information for interfeature relationships includes information for identifying a redundancy of features, and using the information for interfeature relationships to inspect the mask further comprises:
determining that at least one feature is functional; and
waiving one or more defects on features redundant to the functional feature.

6. A system for inspecting a mask having a plurality of mask elements, the system comprising:
means for generating integrated circuit design data and using information for interfeature relationships of the integrated circuit design data to provide contextual information for elements within the integrated circuit design, the contextual information comprising priority, ordering or inspection parameter information of the mask elements; means for using the contextual information to guide inspection of the mask, wherein analysis is performed to allocate mask inspection resources commensurate with the design or manufacturing specific context of the elements within the integrated circuit design data; and means for inspecting the mask using mask inspection resources allocated based upon the contextual information, wherein mask resources are allocated based upon the contextual information by adjusting the power, size, shape, order, resolution, or timing of an inspection beam.

7. The system of claim 6, wherein the interfeature relationships are on one layer of the integrated circuit design.

8. The system of claim 6, wherein the interfeature relationships are across multiple layers of the integrated circuit design.

9. The system of claim 6, wherein the interfeature relationships comprise:
interfeature process proximity effects;
interfeature coupling across layers;
interfeature electronic relationships; or
wire interconnects longer than a given length.

10. The system of claim 6, wherein the information for interfeature relationships includes information for identifying a redundancy of features, and said means for using the information for interfeature relationships to inspect the mask further comprises:
means for determining that at least one feature is functional; and
means for waiving one or more defects on features redundant to the functional feature.

11. The method of claim 1, wherein using information for interfeature relationships comprises using information for interfeature relationships to inspect the mask by inspecting elements of the mask in an order based on the interfeature relationships.

12. The system of claim 6, wherein the means for using information for interfeature relationships of the integrated circuit design data determines an order of elements of the mask to be inspected based on the interfeature relationships.

13. The method of claim 1, wherein portions of the mask are assigned different priorities according to the interfeature relationships.

14. The system of claim 6, wherein portions of the mask are assigned different priorities according to the interfeature relationships.

15. The method of claim 1, wherein the priority information includes information indicative of the importance of a mask element relative to another mask element.

16. The method of claim 1, wherein the priority information includes information indicative of an inspection order for mask elements.

17. The method of claim 1, wherein generating integrated circuit design data includes impact information of a defect or a potential defect on or mask element.

18. The method of claim 17, wherein impact information is used for determining interfeature relationships between mask elements of the integrated circuit design data to inspect the mask.

19. The method of claim 17, wherein the impact information includes information indicative of the operative physics of mask element.

* * * * *